US009214374B2

(12) United States Patent
Lee et al.

(10) Patent No.: US 9,214,374 B2
(45) Date of Patent: Dec. 15, 2015

(54) SEMICONDUCTOR DEVICES INCLUDING STRESS RELIEF STRUCTURES

(75) Inventors: Dosun Lee, Gwangju (KR); Kiyoung Yun, Suwon-si (KR); Yeonglyeol Park, Yongin-si (KR); Gilheyun Choi, Seoul (KR); Kisoon Bae, Yongin-si (KR); Kwangjin Moon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 13/418,915

(22) Filed: Mar. 13, 2012

(65) Prior Publication Data

US 2012/0292746 A1 Nov. 22, 2012

(30) Foreign Application Priority Data

May 17, 2011 (KR) ........................ 10-2011-0046418

(51) Int. Cl.
*H01L 21/683* (2006.01)
*H01L 21/768* (2006.01)
(Continued)

(52) U.S. Cl.
CPC ...... *H01L 21/6835* (2013.01); *H01L 21/76898* (2013.01); *H01L 23/481* (2013.01); *H01L 23/585* (2013.01); *H01L 23/3128* (2013.01); *H01L 24/48* (2013.01); *H01L 25/0657* (2013.01); *H01L 25/18* (2013.01); *H01L 2221/6834* (2013.01); *H01L 2221/68327* (2013.01); *H01L 2224/02166* (2013.01); *H01L 2224/0401* (2013.01); *H01L 2224/0557* (2013.01); *H01L 2224/05567* (2013.01); *H01L 2224/05624* (2013.01); *H01L 2224/05647* (2013.01); *H01L 2224/05684* (2013.01); *H01L 2224/06181* (2013.01); *H01L 2224/131* (2013.01); *H01L 2224/16145* (2013.01); *H01L 2224/16146* (2013.01); *H01L 2224/16225* (2013.01);

(Continued)

(58) Field of Classification Search
USPC .................. 257/621, 774, E21.581, E21.597; 438/421, 424
See application file for complete search history.

(56) References Cited

U.S. PATENT DOCUMENTS

| 6,093,633 A | 7/2000 | Matsumoto |
| 6,284,148 B1 | 9/2001 | Laermer et al. |

(Continued)

FOREIGN PATENT DOCUMENTS

| JP | 09-237834 | 9/1997 |
| JP | 2005-123607 | 5/2005 |

(Continued)

OTHER PUBLICATIONS

Lu et al., "Thermo-Mechanical Analysis of Through Silicon Vias in 3-D Integration", SEMATECH Workshop, The University of Texas at Austin, Sep. 25-26, 2008, 26 pages.

(Continued)

*Primary Examiner* — Cheung Lee
*Assistant Examiner* — Stephen Bradley
(74) *Attorney, Agent, or Firm* — Myers Bigel Sibley & Sajovec, PA

(57) ABSTRACT

A microelectronic device includes a substrate having at least one microelectronic component on a surface thereof, a conductive via electrode extending through the substrate, and a stress relief structure including a gap region therein extending into the surface of the substrate between the via electrode and the microelectronic component. The stress relief structure is spaced apart from the conductive via such that a portion of the substrate extends therebetween. Related devices and fabrication methods are also discussed.

26 Claims, 23 Drawing Sheets

(51) Int. Cl.
   *H01L 23/48*   (2006.01)
   *H01L 23/58*   (2006.01)
   *H01L 23/31*   (2006.01)
   *H01L 23/00*   (2006.01)
   *H01L 25/065*   (2006.01)
   *H01L 25/18*   (2006.01)

(52) U.S. Cl.
   CPC .......... *H01L2224/16227* (2013.01); *H01L 2224/48227* (2013.01); *H01L 2225/0651* (2013.01); *H01L 2225/06513* (2013.01); *H01L 2225/06517* (2013.01); *H01L 2225/06541* (2013.01); *H01L 2225/06565* (2013.01); *H01L 2924/00014* (2013.01); *H01L 2924/1305* (2013.01); *H01L 2924/13091* (2013.01); *H01L 2924/1431* (2013.01); *H01L 2924/1434* (2013.01); *H01L 2924/15311* (2013.01)

(56) References Cited

U.S. PATENT DOCUMENTS

| | | | |
|---|---|---|---|
| 7,319,274 | B2 | 1/2008 | Beyer et al. |
| 7,365,001 | B2* | 4/2008 | Yang et al. ............... 438/622 |
| 7,422,940 | B2 | 9/2008 | Schindler et al. |
| 7,563,314 | B2 | 7/2009 | Breton et al. |
| 7,705,455 | B2* | 4/2010 | Miyakawa et al. ........... 257/737 |
| 7,799,678 | B2 | 9/2010 | Kropewnicki et al. |
| 7,910,473 | B2 | 3/2011 | Chen |
| 7,994,641 | B2* | 8/2011 | Inohara ............... 257/774 |
| 8,362,622 | B2* | 1/2013 | Sproch et al. ............... 257/774 |
| 2004/0097065 | A1 | 5/2004 | Lur et al. |
| 2004/0157165 | A1 | 8/2004 | Oh |
| 2004/0169282 | A1 | 9/2004 | Koh |
| 2009/0115019 | A1 | 5/2009 | Lee et al. |
| 2009/0134498 | A1 | 5/2009 | Ikeda et al. |
| 2009/0243047 | A1 | 10/2009 | Wolter et al. |
| 2010/0001409 | A1* | 1/2010 | Humbert et al. ............... 257/774 |
| 2010/0164117 | A1 | 7/2010 | Chen |
| 2010/0176494 | A1 | 7/2010 | Chen |
| 2010/0193954 | A1* | 8/2010 | Liu et al. ............... 257/751 |
| 2010/0270597 | A1* | 10/2010 | Sproch et al. ............... 257/255 |
| 2011/0062547 | A1* | 3/2011 | Onishi et al. ............... 257/510 |
| 2011/0095367 | A1* | 4/2011 | Su et al. ............... 257/355 |
| 2011/0133335 | A1 | 6/2011 | Chen |
| 2012/0013022 | A1* | 1/2012 | Sabuncuoglu Tezcan et al. ............... 257/774 |
| 2012/0139122 | A1* | 6/2012 | Honjo ............... 257/773 |
| 2012/0139127 | A1* | 6/2012 | Beyne ............... 257/774 |

FOREIGN PATENT DOCUMENTS

| | | |
|---|---|---|
| JP | 2006339440 A | 12/2006 |
| JP | 2008071842 A | 3/2008 |
| JP | 2009-129953 A | 6/2009 |
| JP | 2009246189 A | 10/2009 |
| JP | 2010-135348 | 6/2010 |
| JP | 2010157588 A | 7/2010 |
| KR | 20040049872 A | 6/2004 |
| KR | 20040070709 A | 8/2004 |
| KR | 1020050071060 A | 7/2005 |
| KR | 20080111952 A | 12/2008 |
| KR | 1020090044669 A | 5/2009 |
| KR | 20100073951 A | 7/2010 |

OTHER PUBLICATIONS

Miranda et al., "Thermo-Mechanical Characterization of Copper Through-Wafer Interconnects", 2006 Electronic Components and Technology Conference, Department of Materials Science and Engineering, Boise State University, © 2006 IEEE, pp. 844-848.

Okoro et al., "Extraction of the Appropriate Material Property for Realistic Modeling of Through-Silicon-Vias using μ-Raman Spectroscopy", © 2008 IEEE, pp. 16-18.

Ryu et al., "Impact of Near-Surface Thermal Stresses on Interfacial Reliability of Through-Silicon-Vias for 3-D Interconnects", Jun. 25, 2010, © 2010 IEEE, 9 pages.

Zhang, Xuefeng, "Chip Package Interaction (CPI) and its Impact on the Reliability of Flip-Chip Packages", Dissertation, University of Texas at Austin, Dec. 2009, 190 pages.

* cited by examiner

SEMICONDUCTOR DEVICES INCLUDING STRESS RELIEF STRUCTURES

CROSS-REFERENCE TO RELATED APPLICATIONS

This U.S. non-provisional patent application claims priority under 35 U.S.C. §119 from Korean Patent Application No. 10-2011-0046418, filed on May 17, 2011, the disclosure of which is incorporated by reference herein in its entirety.

BACKGROUND

The present disclosure herein relates to semiconductor devices and methods of forming the same and, more particularly, to semiconductor devices having through via electrodes and methods of forming the same.

In the electronics industry, low cost electronic devices are increasingly in demand with the development of lighter, smaller, faster, multi-functional, and higher performance electronic systems. In response to such a demand, multi-chip stacked package techniques or system in package techniques may be used. The multi-chip stacked package techniques or the system in package techniques may be realized using through silicon via electrodes.

In a multi-chip stacked package or a system-in-package, one or more functions of a plurality of semiconductor devices may be performed in a single semiconductor package. The multi-chip stacked package or the system-in-package may be thicker or taller than a single chip package. However, the multi-chip stacked package or the system in package may have a size similar to a single chip package in terms of a planar area, also referred to as having a similar "footprint." Thus, the multi-chip stacked package or the system-in-package may be used in small and/or mobile devices with high performance requirements, such as mobile phones, notebook computers, memory cards and/or portable camcorders.

SUMMARY

Embodiments of the inventive concept are directed to semiconductor devices and methods of forming the same.

According to some embodiments, a microelectronic device includes a substrate including at least one microelectronic component on a surface thereof, a conductive via electrode extending through the substrate, and a stress relief structure including a gap region therein extending into the surface of the substrate between the via electrode and the microelectronic component. The stress relief structure is spaced apart from the conductive via such that a portion of the substrate extends therebetween.

In some embodiments, the stress relief structure may be a trench extending into the substrate in a direction substantially parallel to the via electrode, and the portion of the substrate may separate the via electrode from the trench.

In some embodiments, the trench may surround the via electrode in plan view.

In some embodiments, the trench may define a continuous polygonal or elliptical shape in plan view.

In some embodiments, the stress relief structure may be a first stress relief structure including a first gap region therein. The device may further include a second stress relief structure including a second gap region therein extending into the surface of the substrate between the first stress relief structure and the at least one microelectronic component. In some embodiments, the second stress relief structure may surround the at least one microelectronic component in plan view.

In some embodiments, the gap region may be defined between sidewalls of the trench. In some embodiments, the gap region may not be enclosed within the trench. On the other hand, in some embodiments, the gap region may be enclosed by at least one of a trench insulating layer, a barrier layer, and/or a conductive layer.

In some embodiments, the stress relief structure may further include a trench insulating layer extending at least partially into the trench. In some embodiments, the trench insulating layer may conformally extend along sidewalls of the trench, and the gap region may be a cavity confined within the trench insulating layer. In some embodiments, sidewalls of the cavity may be tapered as the trench extends into the substrate. On the other hand, in some embodiments, sidewalls of the cavity may be substantially perpendicular to a bottom surface of the trench.

In some embodiments, the device may further include a via insulating layer extending along sidewalls of the via electrode between the via electrode and the trench. The via insulating layer and the trench insulating layer may be portions of a same material layer.

In some embodiments, a diameter of the via electrode may be greater than a width of the stress relief structure in plan view.

In some embodiments, the width of the stress relief structure may be about 10 micrometers or less. In some embodiments, a depth of the stress relief structure may be about 2.5 micrometers or more.

In some embodiments, the portion of the substrate may separate the stress relief structure from the via electrode by a distance of at least 0.1 micrometers.

In some embodiments, the at least one microelectronic component on the surface of the substrate may be laterally spaced apart from the stress relief structure by about 5 micrometers or less. In some embodiments, the at least one microelectronic component on the surface of the substrate may be laterally spaced apart from the stress relief structure by about 1 micrometers or less.

In some embodiments, the stress relief structure may extend into the surface of the substrate beyond a well region of the at least one microelectronic component.

In some embodiments, the stress relief structure may extend completely through the substrate.

In some embodiments, the stress relief structure may be confined below the surface of the substrate including the at least one microelectronic component thereon.

In some embodiments, the device may include one or more interlayer insulating layers on the surface of the substrate having the at least one microelectronic component thereon. The stress relief structure may extend beyond the surface of the substrate and into at least one of the one or more interlayer insulating layers.

In some embodiments, the conductive via may include a conductive layer and a barrier layer configured to prevent atomic diffusion from the conductive layer into the substrate.

In some embodiments, a device isolation structure may extend into the surface of the substrate and may be spaced apart from the stress relief structure. The device isolation structure may surround the at least one microelectronic component on the surface of the substrate in plan view.

In some embodiments, a multi-chip module may include a module substrate; and a first microelectronic device as described herein on the module substrate. The via electrode may provide an electrical connection between the first microelectronic device and the module substrate.

In some embodiments, the module may include a second microelectronic device on the first microelectronic device, and the via electrode may provide an electrical connection between the second microelectronic device and the module substrate.

In some embodiments, the module may be a system in package (SIP), one of the first and second microelectronic devices may be a memory device, and the other of the first and second microelectronic devices may be a memory controller.

In some embodiments, an electronic system includes a processor, a memory, a user interface, and a bus configured to provide communication between the processor, the memory, and the user interface. At least one of the processor and the memory may include a microelectronic device as described herein.

According to further embodiments, a microelectronic device includes a substrate, a conductive via electrode extending through the substrate, and a stress relief structure including a gap region therein extending into a surface of the substrate and surrounding the via electrode in plan view. The stress relief structure is spaced apart from the via electrode such that a portion of the substrate extends therebetween to separate the via electrode from the stress relief structure.

In some embodiments, at least one microelectronic component may be provided on the surface of the substrate and spaced apart from the stress relief structure. The stress relief structure may separate the at least one microelectronic component from the via electrode.

In some embodiments, the stress relief structure may be an annular trench extending into the substrate in a direction substantially parallel to the via electrode, the gap region may be defined between sidewalls of the trench, and the portion of the substrate may separate the via electrode from the trench by a distance of at least 0.1 micrometers.

In some embodiments, a device isolation structure may extend into the surface of the substrate and may surround the at least one microelectronic component in plan view. The device isolation structure may separate the at least one microelectronic component from the stress relief structure.

According to still further embodiments, a method of fabricating a microelectronic device includes forming a stress relief structure extending into a surface of a substrate, the stress relief structure including a gap region therein, forming a conductive via electrode extending through the substrate, and forming at least one microelectronic component on the surface of the substrate. The stress relief structure extends into the substrate between the via electrode and the microelectronic component. The stress relief structure is spaced apart from the via electrode such that a portion of the substrate extends therebetween to separate the via electrode from the stress relief structure.

In some embodiments, forming the stress relief structure may include forming a trench extending into the substrate in a direction substantially parallel to the via electrode. In some embodiments, the trench may surround the via electrode in plan view.

In some embodiments, forming the stress relief structure and forming the via electrode may include selectively etching the substrate to define the trench and a via hole extending into the surface of the substrate substantially parallel to and spaced apart from one another, forming the via electrode in the via hole, and recessing the substrate opposite the surface including the via hole therein such that the via electrode extends through the substrate. In some embodiments, the trench and the via hole may be formed substantially simultaneously in a same selective etching step. On the other hand, in some embodiments, selectively etching the substrate may include selectively etching the substrate to define the trench extending into the surface of the substrate, and then selectively etching the substrate to define the via hole extending into the surface of the substrate substantially parallel to the trench and spaced apart therefrom.

In some embodiments, the gap region may be defined between sidewalls of the trench but is not enclosed within the trench. In some embodiments, the gap region may be defined between sidewalls of the trench and may be enclosed by at least one of a trench insulating layer, a barrier layer, and/or a conductive layer.

In some embodiments, forming the stress relief structure may further include forming an insulating layer extending at least partially into the trench. In some embodiments, forming the insulating layer may include conformally forming the insulating layer on sidewalls of the via hole and on sidewalls of the trench, wherein the gap region comprises a cavity confined within portions of the insulating layer on the sidewalls of the trench.

In some embodiments, forming the stress relief structure may include forming the trench in a connection region of the substrate prior to forming the at least one microelectronic component in a device region of the substrate. The stress relief structure may be confined below the surface of the substrate.

In some embodiments, the method may further include forming at least one interlayer insulating layer on the surface of the substrate including the at least one microelectronic component thereon prior to forming the stress relief structure. Forming the stress relief structure may include forming the trench to extend through the at least one interlayer insulating layer.

In one aspect, a semiconductor device includes a substrate including a first surface and a second surface opposite to the first surface. The substrate has a via hole extending from the surface toward the second surface. A semiconductor element is disposed on the first surface of the substrate. A first stress relief structure is disposed in the substrate between the via hole and the semiconductor element. The via hole penetrates the substrate.

In an embodiment, the device may further comprise a through silicon via filling the via hole.

In an embodiment, the through silicon via may include a barrier layer and a metal layer on the barrier layer.

In an embodiment, the first stress relief structure may surround the via hole.

In an embodiment, the first stress relief structure may have a closed loop shape spaced apart from the via hole by a first distance in a plan view.

In an embodiment, the first stress relief structure may extend from the first surface toward the second surface.

In an embodiment, the first stress relief structure may have a depth less than a depth of the via hole, and a portion of the substrate may exist between a bottom surface of the first stress relief structure and the second surface of the substrate.

In an embodiment, the first stress relief structure may include an air gap formed by removing a portion of the substrate.

In an embodiment, the substrate may include a well extending from the first surface toward the second surface, and the semiconductor element may be disposed on the well. A depth of the first stress relief structure may be greater than a depth of the well.

In an embodiment, the depth of the first stress relief structure may be greater than about 2.5 μm.

In an embodiment, the device may further comprise an isolation structure spaced apart from the first stress relief structure and surrounding the semiconductor element.

In an embodiment, the device may further comprise a second stress relief structure spaced apart from the isolation structure and surrounding the well.

In an embodiment, the semiconductor element may include a transistor, and the transistor may be spaced apart from the first stress relief structure by a distance of about 0.5 μm to about 20 μm.

In an embodiment, the device may further comprise an interlayer dielectric layer sequentially stacked on the first surface to cover the semiconductor element. The via hole and the first stress relief structure may extend to penetrate the interlayer dielectric layer.

In another aspect, a method includes providing a substrate having a connection region and a semiconductor element region adjacent to the connection region, etching the substrate in the connection region to form a hole extending from a first surface of the substrate toward a second surface of the substrate opposite to the first surface, forming an air gap surrounding the hole and spaced apart from the hole, and forming a conductive layer filling the hole.

In an embodiment, the air gap may extend from the first surface of the substrate toward the second surface of the substrate, and the air gap may have a depth less than a depth of the hole.

In an embodiment, the method may further comprise forming a semiconductor element on the substrate in the semiconductor element region prior to formation of the hole and forming an interlayer dielectric layer on the first surface of the substrate to cover the semiconductor element.

In an embodiment, the hole and the air gap may be formed to penetrate the interlayer dielectric layer.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

The inventive concept will become more apparent in view of the attached drawings and accompanying detailed descriptions.

DETAILED DESCRIPTION OF THE EMBODIMENTS

Figure 1A:
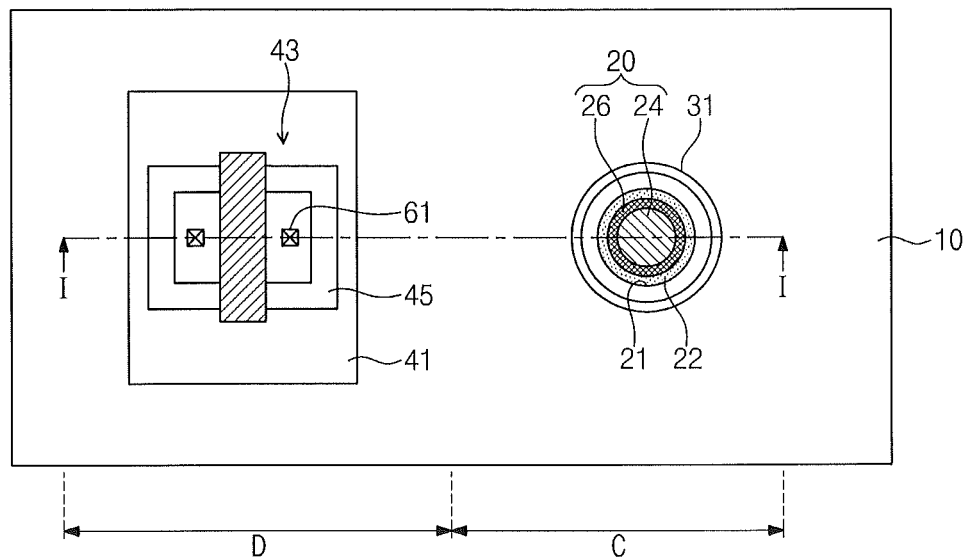
FIG. 1A is a plan view illustrating a semiconductor device according to an embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. Moreover, it will be understood that when an element such as a layer, region or substrate is referred to as being "on" another element, it can be directly on the other element or intervening elements may be present. In contrast, the terms "directly on," "directly connected," or "directly coupled" mean that there are no intervening elements. Similarly, it will be understood that when an element such as a layer, region or substrate is referred to as being "between" two different elements, it can be directly interposed between the two different elements without any intervening element or intervening elements may be present therebetween. In contrast, the term "directly between" means that there are no intervening elements.

It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with reference to cross-sectional views as ideal exemplary views of the inventive concept. Accordingly, shapes of the exemplary views may be modified according to manufacturing techniques and/or allowable tolerances. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Figure 1B:
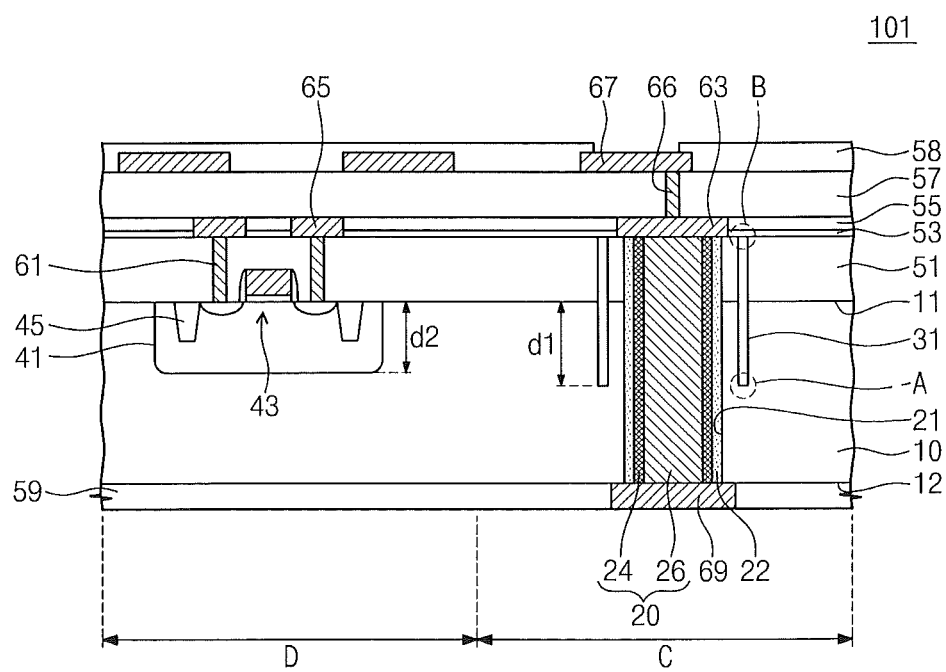
FIG. 1B is a cross sectional view taken along a line I-I' of FIG. 1A.
Figure 1C:
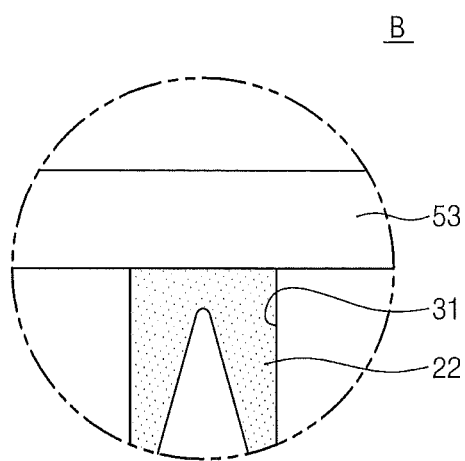
FIG. 1C is an enlarged view of a portion 'B' of FIG. 1B.
Figure 1D:
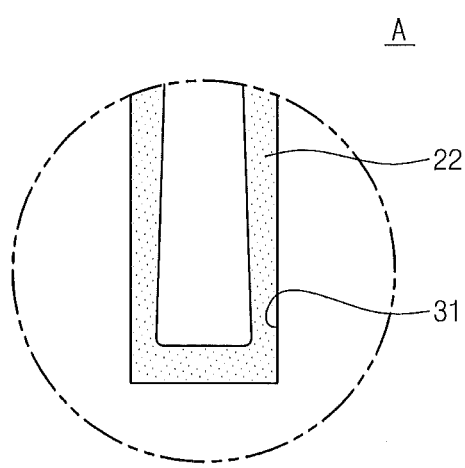
FIG. 1D is an enlarged view of a portion 'A' of FIG. 1B.

FIG. 1A is a plan view illustrating a semiconductor device according to an embodiment of the inventive concept, and FIG. 1B is a cross sectional view taken along a line I-I' of FIG. 1A. FIG. 1C is an enlarged view of a portion 'A' of FIG. 1B, and FIG. 1D is an enlarged view of a portion 'B' of FIG. 1B. For the purpose of ease and convenience in explanation, a region including a conductive via electrode, also referred to herein as a through silicon via, will be illustrated in more detail.

Referring to FIGS. 1A to 1D, a substrate 10 of the semiconductor device 101 may include a first surface 11 and a second surface 12 opposite to the first surface 11. The substrate 10 may include a connection region C and a circuit region or semiconductor element region D adjacent to the connection region C in a plan view. The substrate 10 may be doped with P-type impurities A well region 41 may be disposed in the substrate 10 of the semiconductor element region D. The well 41 may be disposed to be adjacent to the first surface 11 of the substrate 10. For example, the well 41 may extend from the first surface 11 toward the second surface 12. A microelectronic component or semiconductor element 43 may be disposed in and on the well 41. The semiconductor element 43 may be a transistor in some embodiments. For example, the semiconductor element 43 may be an NMOS transistor, a PMOS transistor or bipolar transistor. An isolation structure 45 may be disposed to surround the semiconductor element 43. The isolation structure 45 may be formed in the well 41 using a shallow trench isolation (STI) technique. According to the drawing of FIGS. 1A and 1B, the semiconductor element 43 is illustrated as a single element. However, the number of semiconductor elements 43 is not limited to one. For example, the semiconductor element 43 may be one of plurality of elements.

A first interlayer dielectric layer 51 may be disposed on the first surface 11 of the substrate 10 to cover the semiconductor element 43. The first interlayer dielectric layer 51 may include a silicon oxide layer.

A via hole 21 may be formed to extend through or penetrate the substrate 10 and the first interlayer dielectric layer 51 in the connection region C. The via hole 21 may extend from the first interlayer dielectric layer 51 on the first surface 11 toward the second surface 12. The via hole 21 may have a depth of about 50 μm (micrometers) in some embodiments.

A through silicon via 20 may fill and extend through the via hole 21. The through silicon via 20 may be exposed at the second surface 12. A via hole insulation layer 22 may be disposed between the through silicon via 20 and a sidewall of the via hole 21. The via hole insulation layer 22 may include a silicon oxide layer, a silicon nitride layer or a combination thereof. In some embodiments, the via hole insulation layer 22 may be a silicon oxide layer. Further, a polymer layer having a low dielectric constant may be additionally formed on a sidewall of the via hole insulation layer 22. In some embodiments, the polymer layer may be formed of a carbon-fluorine (CF) based polymer material.

The through silicon via 20 may include a barrier layer 24 and a conductive layer 26 on a sidewall of the barrier layer 24. For example, the conductive layer 26 may be surrounded by the barrier layer 24. The barrier layer 24 may include a single layer such as a titanium layer, a titanium nitride layer, a tantalum layer, a tantalum nitride layer, a ruthenium layer, a cobalt layer, a manganese layer, a tungsten nitride layer, a nickel layer or a nickel boride layer. Alternatively, the barrier layer 24 may include a double layer such as a titanium/titanium nitride (Ti/TiN) layer. The barrier layer 24 may reduce or prevent metal atoms in the conductive layer 26 from diffusing into the substrate 10. That is, the conductive layer 26 may include a metal layer. In some embodiments, the conductive layer 26 may include a silver layer, a gold layer, a copper layer, an aluminum layer, a tungsten layer and/or an indium layer.

A first stress relief structure 31 may be spaced apart from the via hole 21 to surround the via hole 21. A portion of the substrate 10 may be disposed between the first stress relief structure 31 and the through silicon via 20. That is, the through silicon via 20 may be stably fixed in the via hole 21 by the surrounding portion of the substrate 10 since no air gap exists between the first stress relief structure 31 and the through silicon via 20.

The first stress relief structure 31 may extend into the first surface 11 of the substrate 10 toward the second surface 12 of the substrate 10 between the through silicon via 20 and the semiconductor element 43. The first stress relief structure 31 may also upwardly extend to penetrate the first interlayer dielectric layer 51. In this case, an upper portion of the first stress relief structure 31 may be coplanar with an upper portion of the via hole 21. The first stress relief structure 31 may be defined by an annular, linear, or other-shaped trench extending into the substrate 10 in a direction substantially parallel to the TSV 20.

The first stress relief structure 31 may have a depth less than that of the via hole 21. The first stress relief structure 31 may not be exposed at the second surface 12. That is, the first stress relief structure 31 may not penetrate or extend completely through the substrate 10 in some embodiments. The first stress relief structure 31 may include a gap region therein. The gap region may be a void or cavity defined between sidewalls of a trench in the substrate 10 and/or by an insulation layer therein, and may be filled with air or another gaseous material in some embodiments. The gap region may be open in some embodiments, or may be fully enclosed in other embodiments. In this case, the via hole insulation layer 22 may be additionally disposed on an inner sidewall of a trench defining the stress relief structure 31 and in an upper portion of the trench, thereby filling a portion or an entire portion of the trench (see FIGS. 1C, 1D and 1E). As described herein, the trench that defines the stress relief structure 31 may be an open or enclosed structure having opposing sidewalls and a surface therebetween defined by portions of the substrate 10. The trench may have a continuous annular shape surrounding the through silicon via 20 in plain view in some embodiments. The gap region may be bounded by the sidewalls of the trench and/or by one or more layers on the sidewalls of the trench.

Figure 1E:
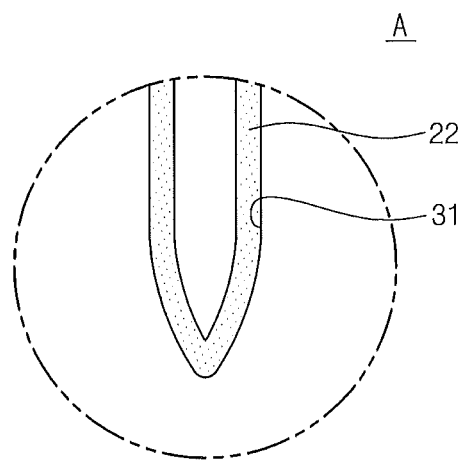
FIG. 1E is an enlarged view of an alternate portion 'A' of FIG. 1B.

A width of the first stress relief structure 31 may be gradually reduced or narrowed as it becomes closer to the second surface 12 (see FIG. 1E). That is, a lower width of the first stress relief structure 31 may be less than an upper width of the first stress relief structure 31. Alternatively, a sidewall of the first stress relief structure 31 may be substantially perpendicular to a bottom surface of the first stress relief structure 31 (see FIG. 1D), such that the stress relief structure 31 has a substantially uniform width.

The first stress relief structure 31 may have a continuous or closed loop shape which is spaced apart from the via hole 21 by a first distance, when viewed from a plan view. The first stress relief structure 31 may have an elliptical shape (such as a circular shape) or a polygonal shape (such as a rectangular shape or an octagonal shape) in a plan view. Alternatively, the first stress relief structure 31 may have a discontinuous or dashed loop or other discontinuous shape which is spaced apart from the via hole 21 by the first distance, when viewed from a plan view.

A width (corresponding to a diameter) of the via hole 21 may be greater than a width (corresponding to a horizontal thickness) of the first stress relief structure 31. The width of the via hole 21 may be about 5 µm (micrometers). The width of the first stress relief structure 31 may be within the range of about 1 µm to about 1000 µm, and may be about 10 µm or less in some embodiments. A width (corresponding to the first distance) of the portion of the substrate 10 extending between the via hole 21 and the first stress relief structure 31 may be within the range of about 1 µm to about 5 µm. In some embodiments, the portion of the substrate 10 separates the stress relief structure 31 from the through silicon via 20 by a distance of at least about 0.1 µm.

In general, a semiconductor element formed adjacent to the through silicon via 20 may exhibit poor electrical characteristics and poor reliability. This may be due to a thermal stress of the through silicon via 20 formed of a metal layer. Thus, a keep-out zone (KOZ) in which microelectronic components should not be formed may be defined in the substrate relative to the position of the TSV. A semiconductor device having a general through silicon via (TSV) may have a keep-out zone (KOZ) of about 20 µm. That is, in the general semiconductor devices, the semiconductor elements should be formed to be laterally spaced apart from the general through silicon via (TSV) electrode by at least 20 µm.

According to some embodiments described herein, the first stress relief structure 31 may be disposed in the substrate 10 between the semiconductor element 43 and the through silicon via 20. The well 41 may be spaced apart from the through silicon via 20, and the first stress relief structure 31 may be disposed between the well 41 and the through silicon via 20. The semiconductor element 43 may be formed at a location which is laterally spaced apart from TSV 20 by a distance of about 0.5 µm or less to about 20 µm. Therefore, it is possible to reduce the keep-out zone (KOZ) from the edge of the first stress relief structure 31 into about 1 µm or less or even about 0.5 µm or less. That is, the keep-out zone (KOZ) from the through silicon via 20 may be remarkably reduced due to the presence of the first stress relief structure 31. As a result, the integration density of the semiconductor device may be significantly increased.

A depth d1 of the first stress relief structure 31 may be greater than a depth d2 of the well 41. That is, the depth of the first stress relief structure 31 may correspond to a minimum depth that can prevent the thermal stress of the through silicon via 20 from influencing electrical characteristics of the semiconductor element 43. The depth of the first stress relief structure 31 may be greater than about 1 µm. In an embodiment, the depth of the first stress relief structure 31 may be greater than about 2.5 µm. More generally, the first stress relief structure 31 may be sized and configured to concentrate or contain thermal stress (due to differences in the thermal expansion coefficients of the through silicon via 20 and the substrate 10) within the portion of the substrate 10 between the first stress relief structure 31 and the through silicon via 20, in a manner sufficient to reduce or prevent the thermal stress from affecting the operation of the semiconductor element 43.

A first contact 61 may penetrate or extend through the first interlayer dielectric layer 51 to be connected to at least one impurity region of the semiconductor element 43, for example, source/drain regions of a MOS transistor. A second interlayer dielectric layer 55 may be formed to cover the first interlayer dielectric layer 51. The second interlayer dielectric layer 55 may include a silicon oxide layer. A through silicon via capping layer 53 may be disposed between the first interlayer dielectric layer 51 and the second interlayer dielectric layer 55. The through silicon via capping layer 53 may include a silicon nitride layer.

A first pad 63 may be disposed in the second interlayer dielectric layer 55 and the through silicon via capping layer 53. Similarly, a second pad 65 may also be disposed in the second interlayer dielectric layer 55 and the through silicon via capping layer 53. The first pad 63 may be connected to the through silicon via 20, and the second pad 65 may be connected to the first contact 61. A third interlayer dielectric layer 57 may be disposed on the second interlayer dielectric layer 55. The third interlayer dielectric layer 57 may include a silicon oxide layer. A third pad 67 may be disposed on the third interlayer dielectric layer 57. The third pad 67 may be connected to the first pad 63 through a second contact 66 formed in the third interlayer dielectric layer 57.

A first passivation layer 58 may be disposed to cover the third interlayer dielectric layer 57 and to expose the third pad 67. The first passivation layer 58 may protect an integrated circuit including the semiconductor element 43 from an external environment. The first passivation layer 58 may be formed of a silicon oxide layer, a silicon nitride layer or a combination thereof. The pads 63, 65 and 67 may be formed of an aluminum layer or a tungsten layer. The contacts 61 and 66 may be formed of a tungsten layer.

A second passivation layer 59 may be disposed on the second surface 12 of the substrate 10 opposite to the first surface 11. A fourth pad 69 may be disposed in the second passivation layer 59, and the fourth pad 69 may be connected to the through silicon via 20. The second passivation layer 59 may be formed of a silicon oxide layer, a silicon nitride layer or a combination thereof. The fourth pad 69 may be formed of a copper layer.

Figure 2:
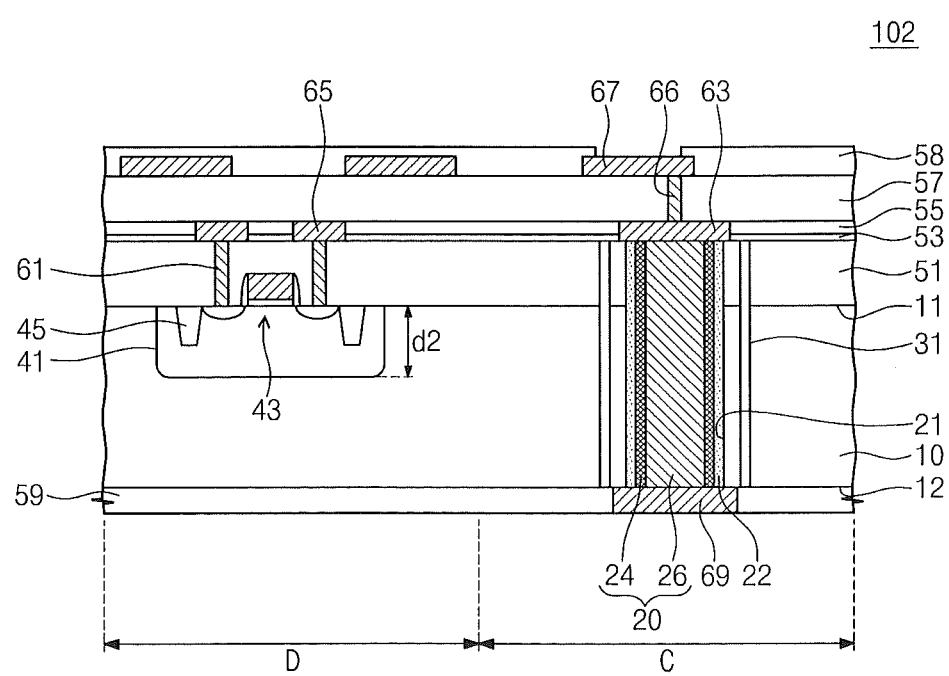
FIG. 2 is a cross sectional view taken along a line I-I' of FIG. 1A to illustrate a semiconductor device according to an embodiment of the inventive concept.

FIG. 2 is a cross sectional view taken along a line I-I' of FIG. 1A to illustrate a semiconductor device according to an embodiment of the inventive concept. For the purpose of simplification in explanation, a semiconductor device 102 according to the present embodiment will be described with differences between the present embodiment and the previous embodiment illustrated in FIGS. 1A to 1D. According to the present embodiment, the first stress relief structure 31 may penetrate completely through the substrate 10, as illustrated in FIG. 2. In FIG. 2, the fourth pad 69 does not overlap with the first stress relief structure 31. In other words, the pad 69 is confined within the boundary defined by the stress relief structure 31 in plan view. However, in another embodiment, the fourth pad 69 may horizontally extend to overlap with the first stress relief structure 31 penetrating completely through the substrate 10.

Figure 3A:
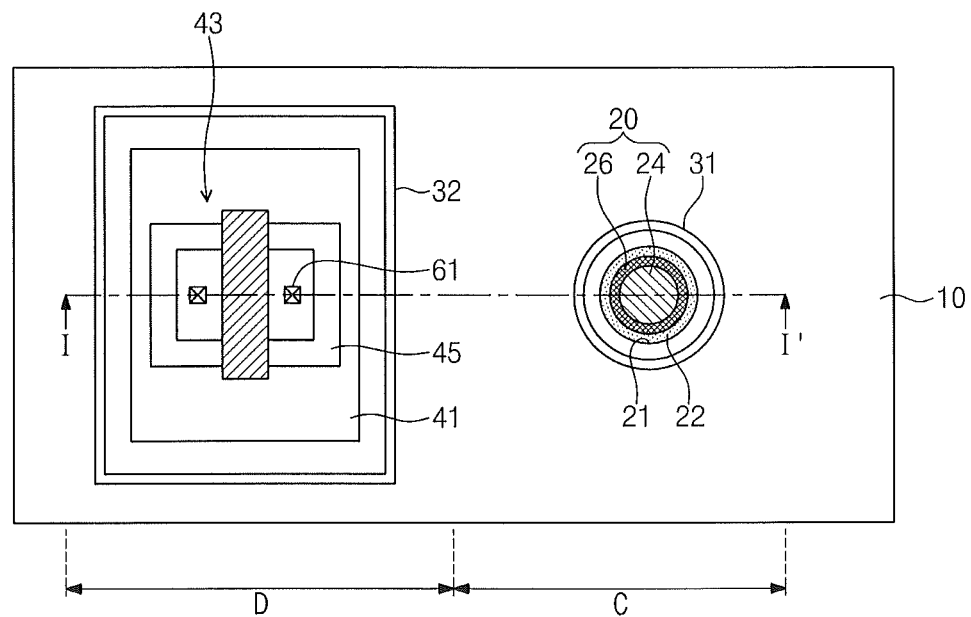
FIG. 3A is a plan view illustrating a semiconductor device according to an embodiment of the inventive concept.
Figure 3B:
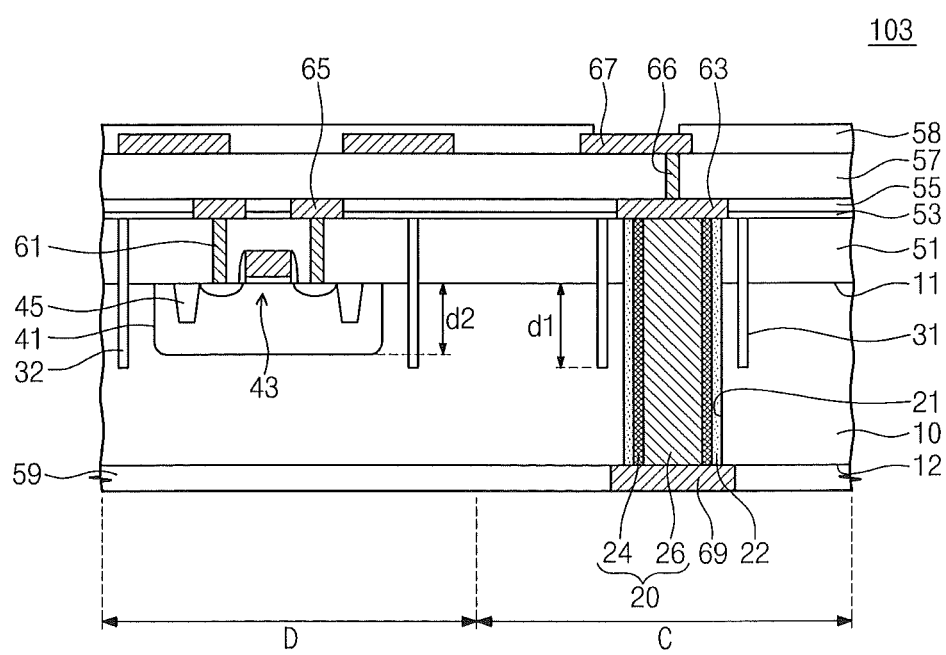
FIG. 3B is a cross sectional view taken along a line I-I' of FIG. 3A.

FIG. 3A is a plan view illustrating a semiconductor device according to an embodiment of the inventive concept, FIG. 3B is a cross sectional view taken along a line I-I' of FIG. 3A. For the purpose of simplification in explanation, a semiconductor device 103 according to the present embodiment will be primarily described with respect differences between the present embodiment and the previous embodiment illustrated in FIGS. 1A to 1D.

Referring to FIGS. 3A and 3B, the semiconductor device 103 may further include a second stress relief structure 32 extending into the first surface 11 of the substrate between the first stress relief structure 31 and the semiconductor element 43. The second stress relief structure 32 may be spaced apart from the isolation structure 45 and may be disposed to surround the semiconductor element 43. The second stress relief structure 32 may also surround the well 41. The second stress relief structure 32 may extend from the first surface 11 toward the second surface 12. The second stress relief structure 32 may penetrate or extend through the first interlayer dielectric layer 51. The second stress relief structure 32 may have a similar depth to the first stress relief structure 31 and may not be exposed at the second surface 12. The second stress relief structure 32 may include a gap region having an air gap therein, and may have a similar depth and a similar shape to the first stress relief structure 31 in some embodiments. However, it will be understood that the width and/or depth of the second stress relief structure 32 need not correspond to that of the first stress relief structure 31.

Figure 4:
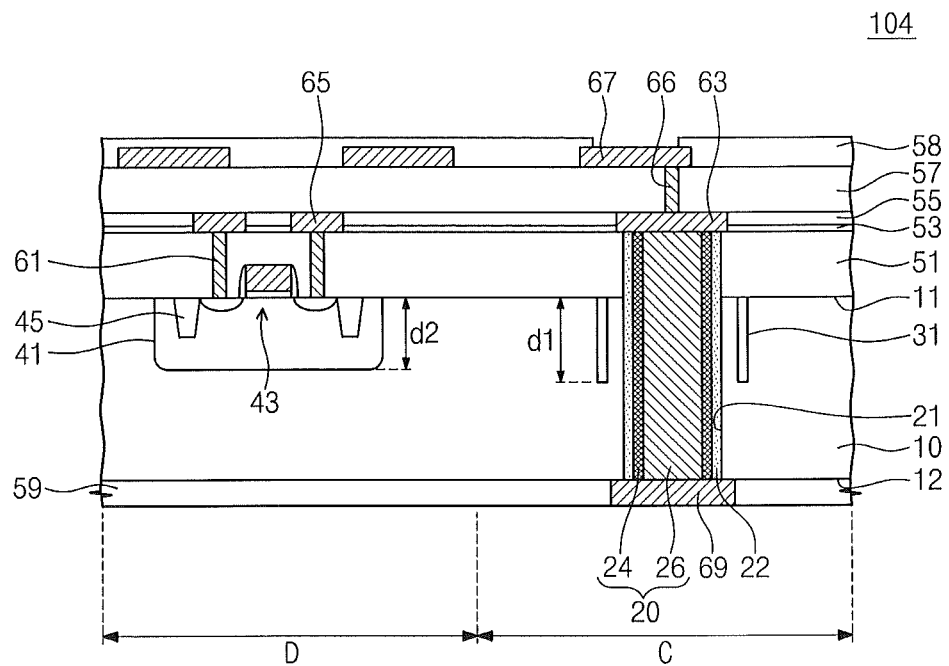
FIG. 4 is a cross sectional view taken along a line I-I' of FIG. 1A to illustrate a semiconductor device according to an embodiment of the inventive concept.

FIG. 4 is a cross sectional view taken along a line I-I' of FIG. 1A to illustrate a semiconductor device according to an embodiment of the inventive concept. For the purpose of simplification in explanation, a semiconductor device 104 according to the present embodiment will be primarily described with respect to differences between the present embodiment and the previous embodiment illustrated in FIGS. 1A to 1D.

Referring to FIG. 4, while the via hole 21 of the semiconductor device 104 penetrates or extends through the first interlayer dielectric layer 51, the first stress relief structure 31 of the semiconductor device 104 may not penetrate or extend into the first interlayer dielectric layer 51. That is, an upper portion of the via hole 21 may be coplanar with a top surface of the first interlayer dielectric layer 51 opposite to the first surface 11, and an upper portion of the first stress relief structure 31 may be coplanar with and confined below the first surface 11 of the substrate 10.

In another embodiment, the first stress relief structure 31 of the semiconductor device 104 may extend toward the second surface 12 to penetrate or extend completely through the substrate 10 as shown in FIG. 2. The semiconductor device 104 may further include the second stress relief structure 32 described with reference to FIGS. 3A and 3B. In this case, the upper portion of the second stress relief structure 32 may be coplanar with the first surface 11 of the substrate 10. The second stress relief structure 32 may include a gap region having an air gap therein, and may be a similar depth and a similar shape to the first stress relief structure 31 in some embodiments.

Figure 5:
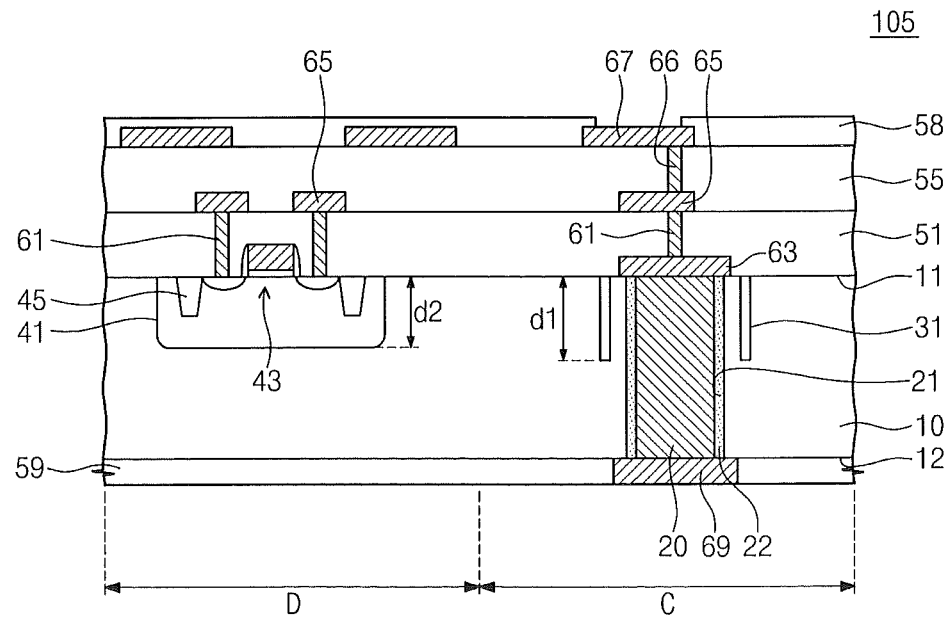
FIG. 5 is a cross sectional view taken along a line I-I' of FIG. 1A to illustrate a semiconductor device according to an embodiment of the inventive concept.

FIG. 5 is a cross sectional view taken along a line I-I' of FIG. 1A to illustrate a semiconductor device according to an embodiment of the inventive concept. For the purpose of simplification in explanation, a semiconductor device 105 according to the present embodiment will be primarily described with regard to differences between the present embodiment and the previous embodiment illustrated in FIGS. 1A to 1D.

Referring to FIG. 5, a via hole 21 and a first stress relief structure 31 of the semiconductor device 105 may not penetrate or extend into the first interlayer dielectric layer 51. That is, upper portions of the via hole 21 and the first stress relief structure 31 may be coplanar with and confined below the first surface 11 of the substrate 10. The through silicon via 20 may be formed of a doped polysilicon layer. Alternatively, the through silicon via 20 may include the barrier layer 24 and the conductive layer 26 described with reference to FIGS. 1A to 1D. In some embodiments, the semiconductor device 105 may not include the via hole insulation layer 22 described above.

A first pad 63 connected to the through silicon via 20 may be disposed on the first surface of the substrate 10. A first interlayer dielectric layer 51 may be disposed on the first surface 11 of the substrate 10 where the semiconductor element 43, the first pad 63 and the first stress relief structure 31 are formed. The first interlayer dielectric layer 51 may include a silicon oxide layer. Second pads 65 may be disposed on the first interlayer dielectric layer 51. Each of the second pads 65 may be connected to a source/drain region of the semiconductor element 43 or the first pad 63 through one of first contacts 61 formed in the first interlayer dielectric layer 51. A second interlayer dielectric layer 55 may be disposed to cover the second pads 65. The second interlayer dielectric layer 55 may include a silicon oxide layer. Third pads 67 may be disposed on the second interlayer dielectric layer 55. At least one of the third pads 67 may be connected to the second pad 65 through a second contact 66 formed in the second interlayer dielectric layer 55.

A first passivation layer 58 may be disposed to at least partially cover the second interlayer dielectric layer 55 and to expose at least one of the third pads 67. The first passivation layer 58 may protect an integrated circuit including the semiconductor element 43 from an external environment.

The first stress relief structure 31 of the semiconductor device 105 may downwardly extend from the first surface 11 to penetrate the substrate 10. The semiconductor device 105 may further include the second stress relief structure 32 described with reference to FIGS. 3A and 3B. In this case, an upper portion of the second stress relief structure 32 may be coplanar with and confined below the first surface 11 of the substrate 10. The second stress relief structure 32 may include a gap region having an air gap, and may have a similar depth and a similar shape to the first stress relief structure 31 in some embodiments.

Figure 6:
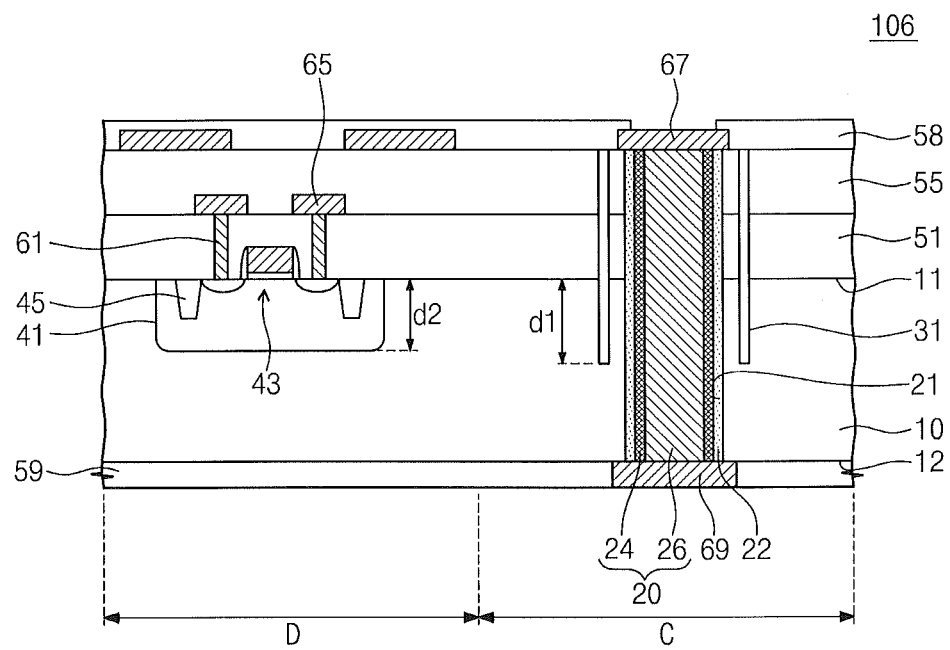
FIG. 6 is a cross sectional view taken along a line I-I' of FIG. 1A to illustrate a semiconductor device according to an embodiment of the inventive concept.

FIG. 6 is a cross sectional view taken along a line I-I' of FIG. 1A to illustrate a semiconductor device according to an embodiment of the inventive concept. For the purpose of simplification in explanation, a semiconductor device 106 according to the present embodiment will be described primarily with regard to differences between the present embodiment and the previous embodiment illustrated in FIGS. 1A to 1D.

Referring to FIG. 6, a first interlayer dielectric layer 51 may be disposed on the first surface of the substrate 10, thereby covering the semiconductor element 43. The first interlayer dielectric layer 51 may include a silicon oxide layer.

A first contact 61 may penetrate the first interlayer dielectric layer 51 to be connected to at least one impurity region of the semiconductor element 43, for example, source/drain regions of a MOS transistor. A second pad 65 may be disposed on the first interlayer dielectric layer 51. The second pad 65 may be connected to the first contact 61. The semiconductor device 106 may not include the first pad 63 described above.

A second interlayer dielectric layer 55 may be disposed to cover the first interlayer dielectric layer 51. The second interlayer dielectric layer 55 may include a silicon oxide layer. A via hole 21 and a first stress relief structure 31 of the semiconductor device 106 may upwardly extend to penetrate and extend through the first and second interlayer dielectric layers 51 and 55. That is, the via hole 21 and the first stress relief structure 31 may extend into the second interlayer dielectric layer 55. A through silicon via 20 in the via hole 21 may be exposed at a top surface of the second interlayer dielectric layer 55 opposite to the first surface 11. An upper portion of the first stress relief structure 31 may be coplanar with an upper portion of the via hole 21.

A third pad 67 may be disposed on the second interlayer dielectric layer 55. The third pad 67 may be connected to the through silicon via 20. A first passivation layer 58 may be disposed to cover the second interlayer dielectric layer 55 and to expose the third pad 67. The first passivation layer 58 may protect an integrated circuit including the semiconductor element 43 from an external environment.

In another embodiment, the first stress relief structure 31 of the semiconductor device 106 may extend toward the second surface 12 to penetrate completely through the substrate 10 with reference to FIG. 2. The semiconductor device 106 may further include the second stress relief structure 32 described with reference to FIGS. 3A and 3B. In this case, the upper portion of the second stress relief structure 32 may be coplanar with the upper portion of the via hole 21. The second stress relief structure 32 may include a gap region having an air gap therein, and may have a similar depth and a similar shape to the first stress relief structure 31 in some embodiments.

Figure 7:
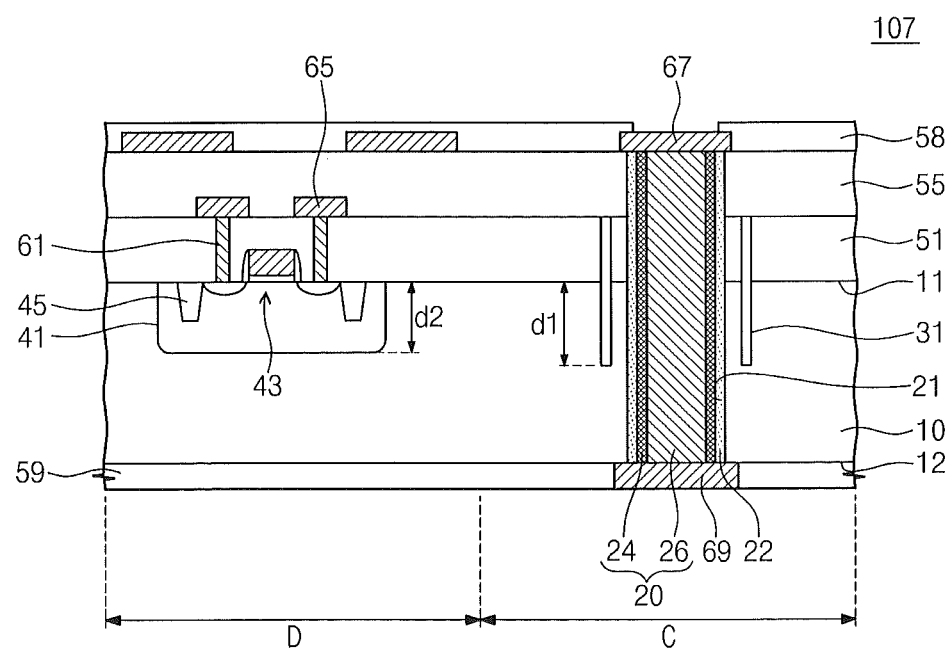
FIG. 7 is a cross sectional view taken along a line I-I' of FIG. 1A to illustrate a semiconductor device according to an embodiment of the inventive concept.

FIG. 7 is a cross sectional view taken along a line I-I' of FIG. 1A to illustrate a semiconductor device according to an embodiment of the inventive concept. For the purpose of simplification in explanation, a semiconductor device 107 according to the present embodiment will be primarily described with regard to differences between the present embodiment and the previous embodiment illustrated in FIG. 6.

Referring to FIG. 7, a first stress relief structure 31 of the semiconductor device 107 may not penetrate or extend into the second interlayer dielectric layer 55. That is, an upper portion of the via hole 21 may be coplanar with a top surface of the second interlayer dielectric layer 55 opposite to the first surface 11, and an upper portion of the first stress relief structure 31 may be coplanar with and confined below a top surface of the first interlayer dielectric layer 51 opposite to the first surface 11.

Figure 8:
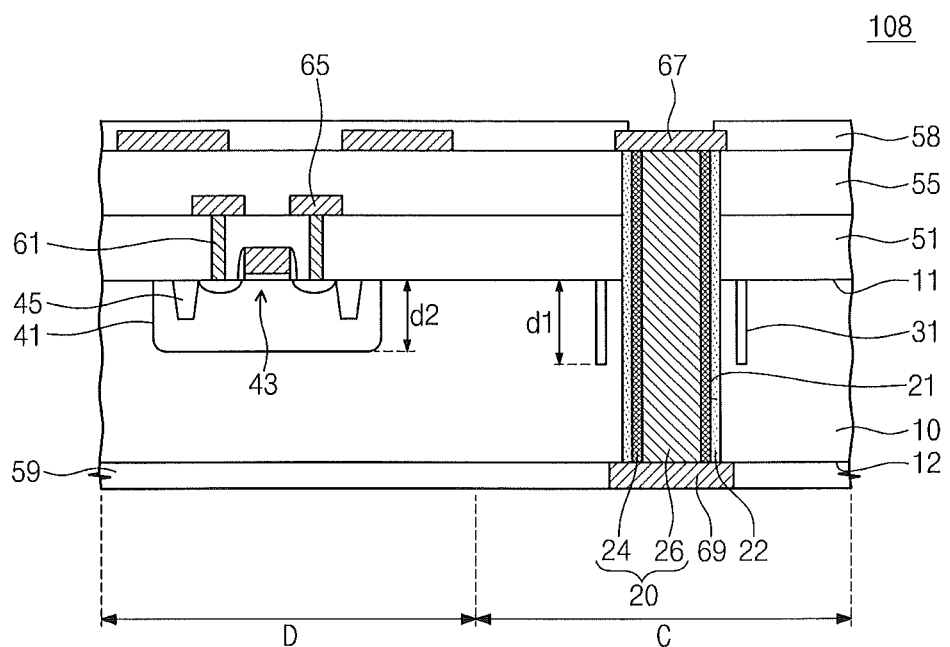
FIG. 8 is a cross sectional view taken along a line I-I' of FIG. 1A to illustrate a semiconductor device according to an embodiment of the inventive concept.

FIG. 8 is a cross sectional view taken along a line I-I' of FIG. 1A to illustrate a semiconductor device according to an embodiment of the inventive concept. For the purpose of simplification in explanation, a semiconductor device 108 according to the present embodiment will be described primarily with regard to differences between the present embodiment and the previous embodiment illustrated in FIG. 6.

Referring to FIG. 8, a first stress relief structure 31 of the semiconductor device 108 may not penetrate or extend into the first and second interlayer dielectric layers 51 and 55. That is, an upper portion of the via hole 21 may be coplanar with a top surface of the second interlayer dielectric layer 55 opposite to the first surface 11, and an upper portion of the first stress relief structure 31 may be coplanar with and confined below the first surface 11 of the substrate 10.

FIGS. 9A to 9G are cross sectional views taken along a line I-I' of FIG. 1A to illustrate methods of forming a semiconductor device shown in FIGS. 1A to 1D.

Figure 9A:
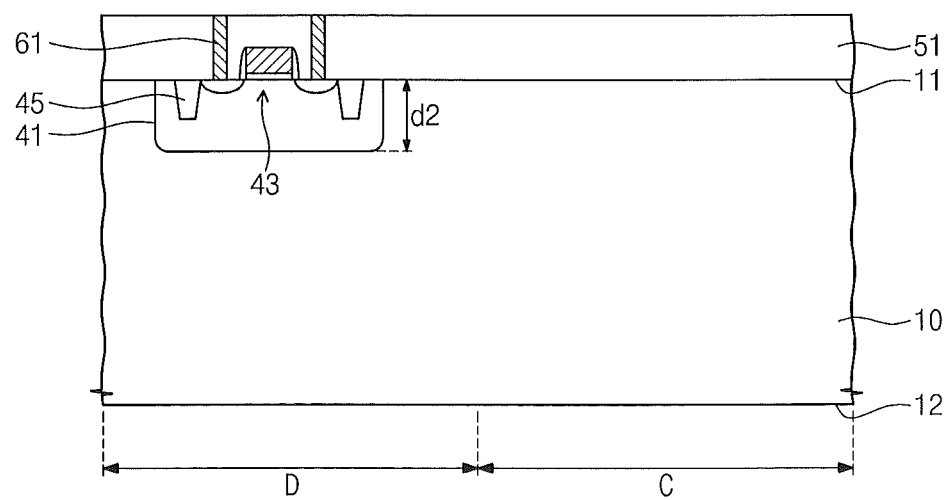
FIGS. 9A to 9G are cross sectional views taken along a line I-I' of FIG. 1A to illustrate methods of forming a semiconductor device shown in FIGS. 1A to 1D.

Referring to FIG. 9A, a substrate 10 may be provided. The substrate 10 may have a connection region C and a circuit or semiconductor element region D adjacent to the connection region C in a plan view. The substrate 10 may include a first surface 11 and a second surface 12 opposite to the first surface 11. The substrate 10 may be doped with P-type impurities.

A well region 41 may be formed in the substrate 10 of the semiconductor element region D. The well 41 may be formed to be adjacent to the first surface 11. The well 41 may be formed by doping the substrate 10 through the first surface 11 with N-type impurities or P-type impurities. The well 41 may extend into the substrate 10 to a depth d2. The depth d2 of the well 41 may be defined as a distance from the first surface 11 to a position that an impurity concentration of the well 41 abruptly decreases.

A microelectronic component or semiconductor element 43 may be formed in and on the well 41. The semiconductor element 43 may be a transistor in some embodiments. For example, the semiconductor element 43 may include an NMOS transistor, a PMOS transistor or a bipolar transistor. An isolation structure 45 may be formed in the well 41 to surround the semiconductor element 43. The isolation structure 45 may be formed using a shallow trench isolation (STI) technique. Even though a single semiconductor element 43 is illustrated in FIG. 9A, the number of semiconductor elements 43 may not be limited to one. That is, the semiconductor device may be one of a plurality of semiconductor elements formed in the region D of the substrate 10.

A first interlayer dielectric layer 51 may be formed on the first surface 11 to cover the semiconductor element 43. The first interlayer dielectric layer 51 may be formed to include a silicon oxide layer. A first contact 61 may be formed to penetrate the first interlayer dielectric layer 51. The first contact 61 may be connected to one of the impurity regions of the semiconductor element 43. For example, the first contact 61 may be connected to a source/drain region of a MOS transistor.

Figure 9B:
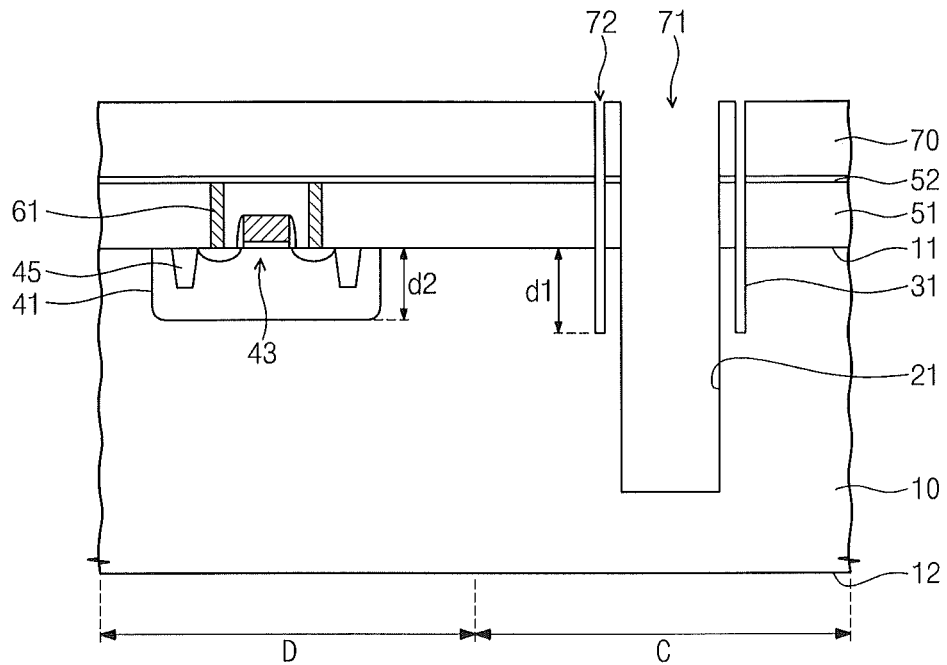

Referring to FIG. 9B, an etch stop layer 52 may be formed on the first interlayer dielectric layer 51. The etch stop layer 52 may be formed to include a silicon nitride layer.

A mask pattern 70 may be formed over the first surface 11 of the substrate 10. The mask pattern 70 may have a first opening 71 and a second opening 72 surrounding the first opening 71. The second opening 72 may be spaced apart from the first opening 71. The first and second openings 71 and 72 may expose portions of the etch stop layer 52 in the connection region C. The first opening 71 may have a substantially circular shape in a plan view. That is, the first opening 71 may be defined by a cylindrical empty region. The second opening 72 may have a closed loop shape spaced apart from the first opening 71 by a first distance in a plan view. The first and second openings 71 and 72 may be concentric in some embodiments. The second opening 72 may have a substantially circular shape, a rectangular shape or an octagonal shape in a plan view. A width (corresponding to a diameter) of the first opening 71 may be greater than a width of the second opening 72. The width of the first opening 71 may be about 5 µm (micrometers). The width of the second opening 72 may be within the range of about 1 µm to about 1000 µm, and may be less than about 10 µm in some embodiments. A width (corresponding to the first distance) of the substrate 10 between the first and second openings 71 and 72 may be at least 0.1 µm, and may be within the range of about 1 µm to about 5 µm. The mask pattern 70 may be formed of a photoresist layer.

The etch stop layer 52, the first interlayer dielectric layer 51 and the substrate 10 may be etched using the mask pattern 70 as an etch mask, thereby forming a via hole 21 and a trench defining a first stress relief structure having a gap region therein (also referred to herein as a first gap) 31 which are vertically aligned with the first opening 71 and the second opening 72 respectively. The substrate 10 may be etched using a Bosch process or a steady state process. The via hole 21 may penetrate the etch stop layer 52 and the first interlayer dielectric layer 51. Further, the via hole 21 may extend from the first surface 11 of the substrate 10 toward the second surface 12 of the substrate 10. The via hole 21 may not penetrate completely through the substrate 10. The first gap 31 may be spaced apart from the via hole 21, and a portion of the substrate 10 may be disposed between the first gap 31 and the via hole 21. The first gap 31 may be defined between sidewalls of the trench and formed to surround the via hole 21 in plan view. The first gap 31 may also penetrate the etch stop layer 52 and the first interlayer dielectric layer 51. Further, the first gap 31 may extend from the first surface 11 of the substrate 10 toward the second surface 12 of the substrate 10.

The width of the second opening 72 is less than that of the first opening 71. Thus, in the event that the via hole 21 and the first gap 31 are simultaneously or concurrently formed using a same etching process, a depth d1 of the first gap 31 in the substrate 10 may be less than a depth of the via hole 21 in the substrate 10. In an embodiment, the via hole 21 may be formed to have a depth which is greater than about 50 µm. The first gap 31 may be formed to have a depth of about 1 µm to about 15 µm. A width of the first gap 31 may narrow or may be gradually reduced as it becomes closer to the second surface 12 (see FIG. 1E). That is, a lower width of the first gap 31 may be less than an upper width of the first gap 31.

Alternatively, the first gap 31 may be formed using a separate etching process prior to or after formation of the via hole 21. The separate etching process for forming the first gap 31 may be a laser drilling process. For example, the first gap 31 may be deeply formed to completely surround the via hole 21. In this case, a sidewall of the first gap 31 may be formed to be substantially perpendicular to a bottom surface of the first gap 31 as illustrated in FIG. 1D.

Figure 9C:
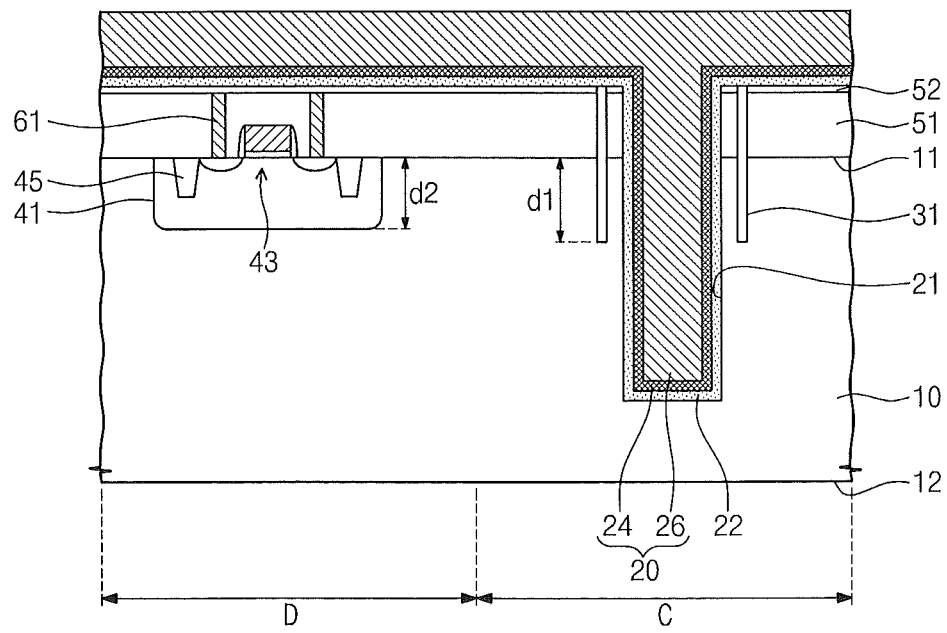

Referring to FIG. 9C, the mask pattern 70 may be removed. A via hole insulation layer 22 may be formed on the substrate where the mask pattern 70 is removed. The via hole insulation layer 22 may be formed to a thickness of about 200 nm. The via hole insulation layer 22 may be formed of a silicon oxide layer, a silicon nitride layer or a combination thereof. In an embodiment, the via hole insulation layer 22 may be formed of a silicon oxide layer. The via hole insulation layer 22 may be formed using an ozone ($O_3$) tetra-ethyl-ortho-silicate (TEOS) chemical vapor deposition (CVD) process. A polymer layer having a low dielectric constant may be additionally formed on the via hole insulation layer 22. The polymer layer may be formed on the via hole insulation layer 22 using a plasma process employing a carbon fluoride (CF) gas as a process gas. The via hole insulation layer 22 may be formed to cover a sidewall and a bottom surface of the via hole 21. The via hole insulation layer 22 may extend onto an upper portion and a sidewall of the first gap 31. The via hole insulation layer 22 may be formed to fill a portion of the first gap 31 and define a void therein (see FIGS. 1C to 1E) in some embodiments. As such, the first gap 31 may be partially filled by the insulation layer 22.

A through silicon via 20 may be formed on the via hole insulation layer 22 to fill the via hole 21. The through silicon via 20 may be formed to include a barrier layer 24 and a conductive layer 26 on the barrier layer 24. A process for forming the through silicon via 20 will be described in detail hereinafter.

The barrier layer 24 may be conformably formed on a surface of the via hole insulation layer 22. In particular, the barrier layer 24 may be conformably formed along an inner surface of the via hole insulation layer 22 in the via hole 21. The barrier layer 24 may be formed to include a titanium layer, a titanium nitride layer, a tantalum layer, a tantalum nitride layer, a ruthenium layer, a cobalt layer, a manganese layer, a tungsten nitride layer, a nickel layer, a nickel boride layer, and/or a double layer of a titanium layer and a titanium nitride layer. The barrier layer 24 may be formed using a sputtering process. The barrier layer 24 may be formed at a temperature of about 375° C. The barrier layer 24 may reduce or prevent metal atoms in a conductive layer (for forming a through silicon via, as described hereinafter) from diffusing into the substrate 10.

The conductive layer 26 may be formed to fill the via hole 21. The conductive layer 26 may be formed to extend onto the barrier layer 24 outside the via hole 21. The conductive layer 26 may be formed in the via hole 21 using an electro plating process, an electroless plating process, or a selective deposition process. The electro plating process may include forming a seed layer on the barrier layer 24 and plating a conductive material on the seed layer. In an embodiment, the seed layer may be selectively formed on the barrier layer 24 inside the via hole 21. In this case, the conductive material may be selectively plated on the seed layer inside the via hole 21, thereby forming the conductive layer 26. The electro plating process may be performed at a room temperature. The seed layer may be formed using a sputtering process. The conductive layer 26 may be formed of a metal layer. For example, the conductive layer 26 may be formed of a silver layer, a gold layer, a copper layer, an aluminum layer, a tungsten layer or an indium layer.

Any one of the barrier layer 24, the seed layer and the conductive layer 26 constituting the through silicon via 20 may be formed to fill or at least extend partially into a portion of the first gap 31 like the via hole insulation layer 22.

Figure 9D:
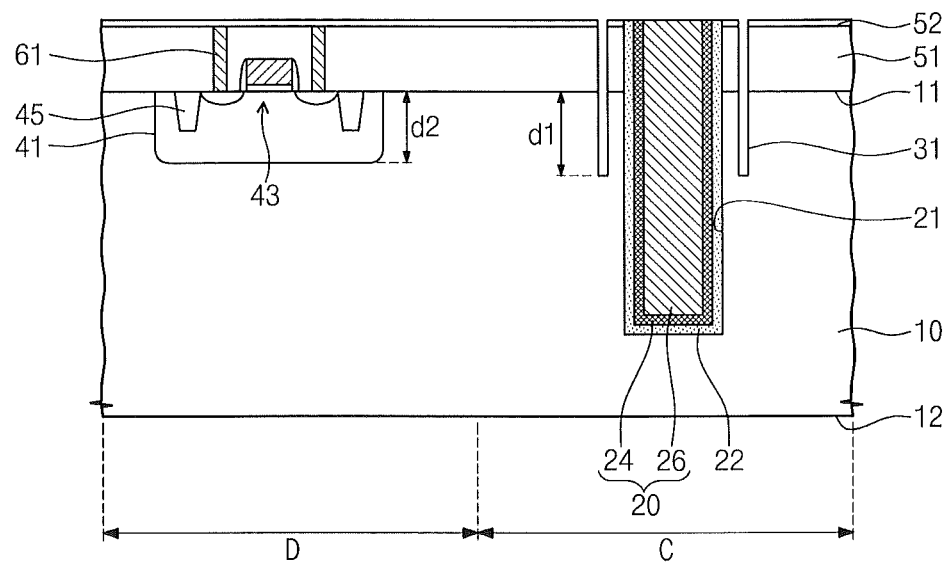

Referring to FIG. 9D, the portions of the layers 22, 24, and/or 26 outside the via hold 21 on the etch stop layer 52 may be removed using a planarization process. During the planarization process, the via hole insulation layer 22 on the etch stop layer 52 may also be removed.

Figure 9E:
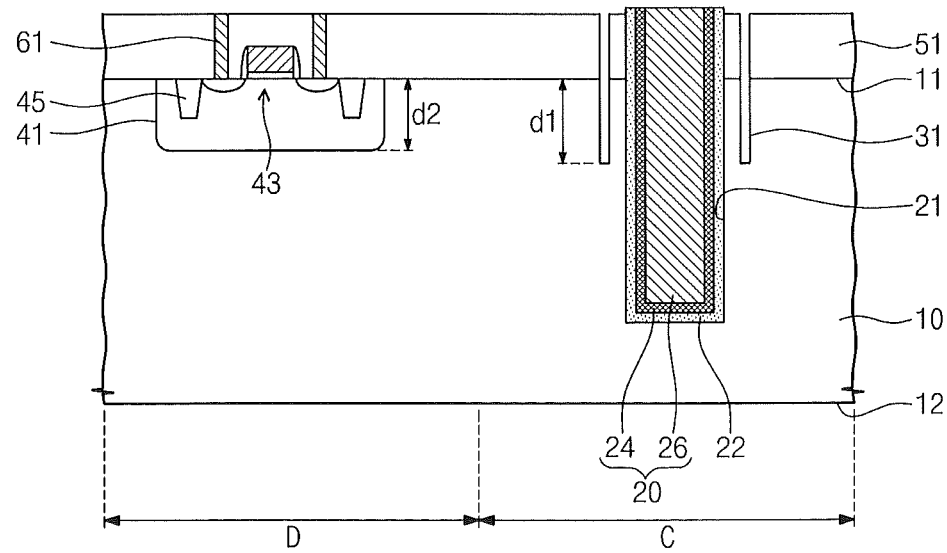
Figure 9F:
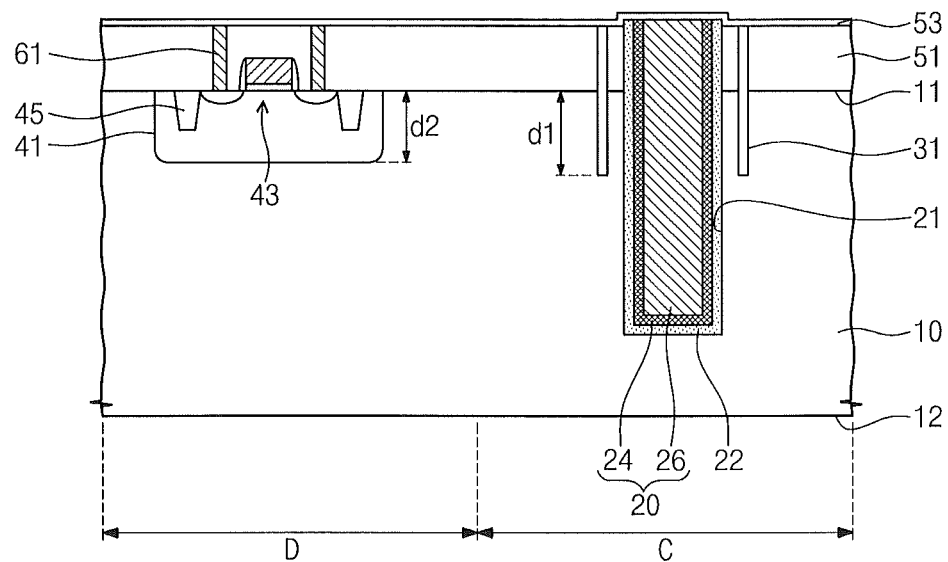

Referring to FIGS. 9E and 9F, the etch stop layer 52 may be removed, and a through silicon via capping layer 53 may be formed on the substrate where the etch stop layer 52 is removed. The through silicon via capping layer 53 may be formed to include a silicon nitride layer.

Figure 9G:
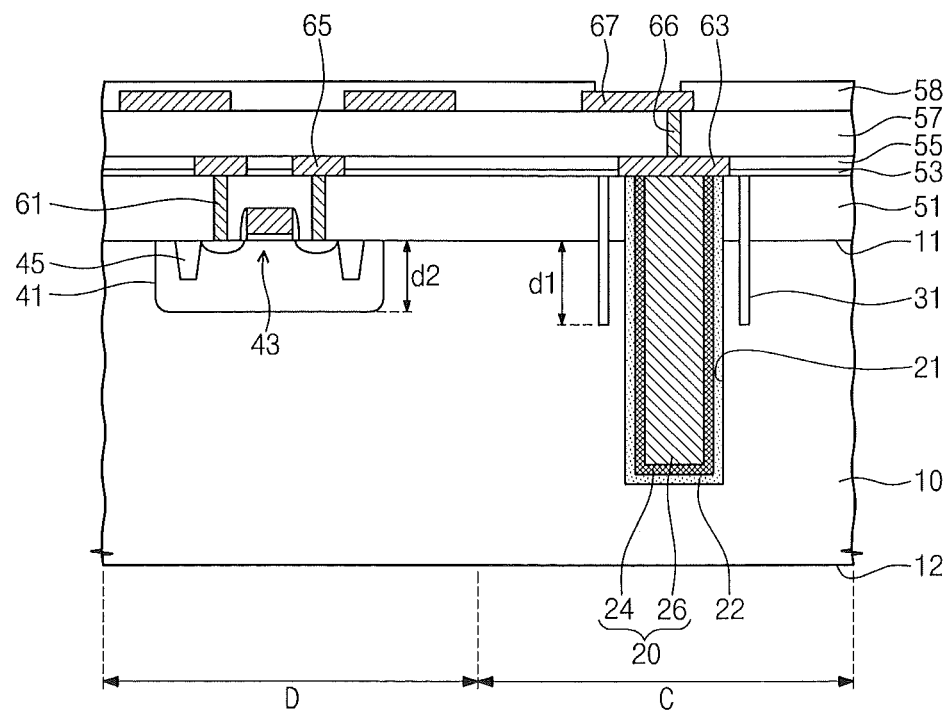

Referring to FIG. 9G, a second interlayer dielectric layer 55 may be formed on the through silicon via capping layer 53. First and second pads 63 and 65 may be formed in the second interlayer dielectric layer 55 and the through silicon via capping layer 53. The first and second pads 63 and 65 may be formed using a damascene process. The first pad 63 may be connected to the through silicon via 20, and the second pad 65 may be connected to the first contact 61. A third interlayer dielectric layer 57 may be formed on the second interlayer dielectric layer 55. The interlayer dielectric layers 51, 55 and 57 may be formed to include a silicon oxide layer. The interlayer dielectric layers 51, 55 and 57 may be formed using a chemical vapor deposition (CVD) process. The interlayer dielectric layers 51, 55 and 57 may be formed at a temperature of about 400° C. The interlayer dielectric layers 51, 55 and 57 may be formed of a tetra-ethyl-ortho-silicate (TEOS) layer.

A second contact 66 may be formed in the third interlayer dielectric layer 57. The second contact 66 may be formed by patterning the third interlayer dielectric layer 57 to form an opening that exposes the first pad 63 and filling the opening with an aluminum layer or a tungsten layer.

A third pad 67 may be formed on the third interlayer dielectric layer 57. The third pad 67 may be connected to the second contact 66. A first passivation layer 58 may be formed to cover the third interlayer dielectric layer 57 and to expose the third pad 67. The first passivation layer 58 may protect an integrated circuit including the semiconductor element 43 from an external environment. The first passivation layer 58 may be formed of a silicon oxide layer, a silicon nitride layer or a combination thereof. The pads 63, 65 and 67 may be formed of an aluminum layer or a tungsten layer.

Referring again to FIG. 1B, a polishing process may be then applied to the second surface 12 of the substrate 10 after formation of the first passivation layer 58 illustrated in FIG. 9G. The polishing process may lead to exposure of the through silicon via 20. The first gap 31 may not be exposed even though the polishing process is finished. Hereinafter, the polishing process will be described in more detail.

First, a carrier substrate may be attached to a top surface of the first passivation layer 58 using an adhesion layer. The carrier substrate may relieve a mechanical stress applied to the substrate 10 while the polishing process is applied to the second surface 12. Further, the carrier substrate may support the substrate that becomes thinned after the polishing process, thereby preventing the thinned substrate from being warped. The carrier substrate may include a glass substrate, a quartz substrate and/or a resin substrate. The adhesion layer may include an ultraviolet reactive adhesive or a thermoplastic adhesive. After the carrier substrate is attached to the first passivation layer 58, the second surface 12 of the substrate 10 may be polished to expose the via hole insulation layer 22. The polishing process may be performed using a grinding technique. The polished second surface 12 may be located at a higher level or a lower level than the exposed surface of the via hole insulation layer 22.

The second surface 12 of the polished substrate 10 may be exposed to an etching process so that the conductive layer 26 and the surrounding via hole insulation layer 22 relatively protrude from the second surface 12 of the etched substrate 10. The etching process may selectively etch the via hole insulation layer 22 to expose the conductive layer 26 adjacent to the second surface 12.

A second passivation layer 59 may be formed on the second surface 12 of the polished and etched substrate 10. A fourth pad 69 may be formed in the second passivation layer 59. The fourth pad 69 may be connected to the through silicon via 20. The second passivation layer 59 may be formed of a silicon oxide layer, a silicon nitride layer or a combination thereof. The fourth pad 69 may be formed of a copper layer.

The first gap 31 may thereby correspond to the first stress relief structure described above.

Methods of forming the semiconductor device 102 according to the embodiment described with reference to FIG. 2 may be similar to the method of forming the semiconductor device 101 described with reference to FIG. 1B. Some differences between the method of forming the semiconductor device 102 and the method of forming the semiconductor device 101 may include the depth of the first gap 31. That is, the first gap 31 of the semiconductor device 102 may be formed to be deeper than the first gap 31 of the semiconductor device 101. Thus, the first gap 31 of the semiconductor device 102 may be exposed after the polishing process applied to the second surface 12 of the substrate 10. That is, the first gap 31 of the semiconductor device 102 of FIG. 2 may penetrate completely through the polished and etched substrate 10.

Methods of forming the semiconductor device 103 described with reference to FIGS. 3A and 3B may be similar to the method of forming the semiconductor device 101 described with reference to FIG. 1B. Some differences between the method of forming the semiconductor device 103 and the method of forming the semiconductor device 101 may include that a second stress relief structure 32 is additionally formed while the first stress relief structure 31 of the semiconductor device 103 is formed, or before or after forming the first stress relief structure 31.

Now, methods of forming the semiconductor device 104 according to the embodiment illustrated in FIG. 4 will be described. FIGS. 10A to 10D are cross sectional views taken along a line I-I' of FIG. 1A to illustrate methods of forming a semiconductor device shown in FIG. 4. For the purpose of simplification in explanation, differences between the methods according to the present embodiment and the methods of forming the semiconductor device 101 illustrated in FIGS. 1A to 1D will be mainly described.

Figure 10A:
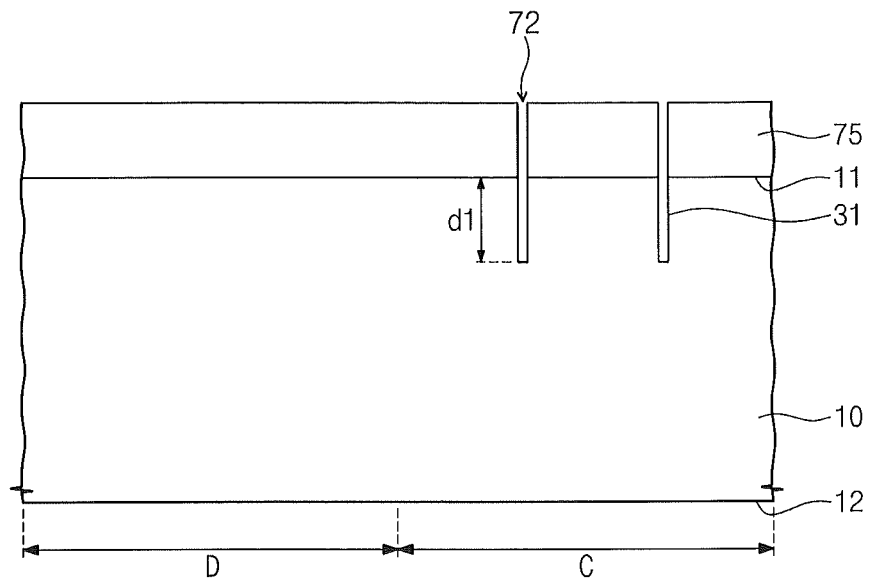
FIGS. 10A to 10D are cross sectional views taken along a line I-I' of FIG. 1A to illustrate methods of forming a semiconductor device shown in FIG. 4.

Referring to FIG. 10A, a substrate 10 may be provided. The substrate 10 may include a connection region C and a circuit or semiconductor element region D adjacent to the connection region C. Further, the substrate 10 may include a first surface 11 and a second surface 12 opposite the first surface 11. The substrate 10 may be doped with P-type impurities.

Prior to formation of a via hole, the substrate 10 may be etched to form a trench defining first gap region 31 between sidewalls thereof. The first gap 31 may be formed using a laser drilling process or an etching process (for example, a Bosch etching process or a steady state etching process).

In case of the laser drilling process, an excimer laser may be applied to the first surface 11 of the substrate 10 to form the first gap 31 surrounding a predetermined region of the substrate 10. In this case, a bottom surface of the first gap 31 may be substantially perpendicular to a sidewall of the first gap 31, as described with reference to FIG. 1D.

In case of the etching process, a first mask pattern 75 may be formed on the first surface 11 of the substrate 10. The first mask pattern 75 may have a second opening 72. The second opening 72 may expose a portion of the first surface 11 in the connection region C. The second opening 72 may define a closed loop shape in a plan view. For example, the second opening 72 may have a circular shape, an elliptical shape, a rectangular shape, or an octagonal or other polygonal shape in plan view. The first mask pattern 75 may be formed of a photoresist layer. The substrate 10 may be etched using the first mask pattern 75 as an etch mask, thereby forming the first gap 31 which is vertically aligned with the second opening 72. A width of the first gap 31 may be gradually reduced as it becomes closer to the second surface 12 (see FIG. 1E).

The first gap 31 may be formed to extend from the first surface 11 toward the second surface 12. The first gap 31 may be formed to have a depth d1.

Figure 10B:
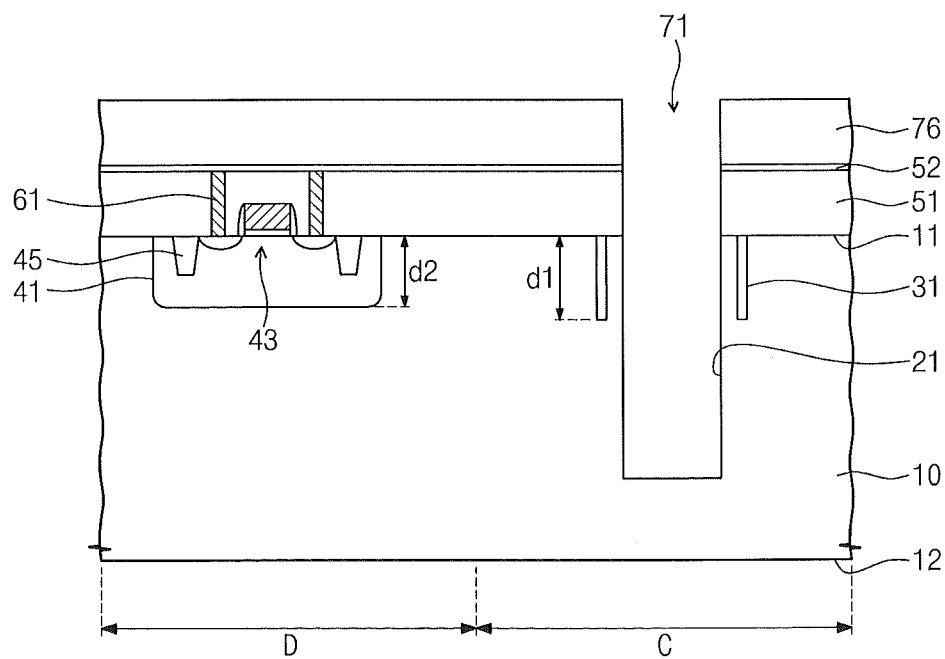

Referring to FIG. 10B, a well region 41 may be formed in the substrate 10 in the semiconductor element region D. The well 41 may be formed to be adjacent to the first surface 11. The well 41 may be formed by doping the substrate 10 through the first surface 11 with N-type impurities or P-type impurities. The well 41 may extend to a depth d2 that is less than the depth d1 of the gap 31. The depth d2 of the well 41 may be defined as a distance from the first surface 11 to a position that an impurity concentration of the well 41 abruptly decreases.

A semiconductor element or other microelectronic component 43 may be formed on and in the well 41. The semiconductor element 43 may include a transistor. For example, the semiconductor element 43 may include an NMOS transistor, a PMOS transistor or a bipolar transistor. A device isolation structure 45 may be formed in the well 41 to surround the semiconductor element 43. The isolation structure 45 may be formed using a shallow trench isolation (STI) technique, and may be spaced apart from the gap 31. Even though a single semiconductor element 43 is illustrated in FIG. 10B, the number of semiconductor elements 43 may not be limited to one. That is, the semiconductor device according to the inventive concept may be formed to include a plurality of semiconductor elements. The first gap 31 may be formed before or after forming the isolation structure 45.

A first interlayer dielectric layer 51 may be formed on the first surface 11 to cover the semiconductor element 43. The first interlayer dielectric layer 51 may be formed to include a silicon oxide layer. A first contact 61 may be formed to penetrate the first interlayer dielectric layer 51. The first contact 61 may be connected to one of impurity regions of the semiconductor element 43. For example, the first contact 61 may be connected to a source/drain region of a MOS transistor.

An etch stop layer 52 may be formed on the first interlayer dielectric layer 51. The etch stop layer 52 may be formed to include a silicon nitride layer.

A second mask pattern 76 may be formed on the etch stop layer 52 opposite the first interlayer dielectric layer 51. The second mask pattern 76 may be formed to have a first opening 71 which is located over a predetermined region surrounded by the first gap 31. That is, the first opening 71 may expose a portion of the etch stop layer 52, which is located over the predetermined region surrounded by the first gap 31. The first opening 71 may define a circular shape in plan view. That is, the first opening 71 may have a cylindrical shape. The first opening 71 may be surrounded by the second opening 72 illustrated in FIG. 10A in plan view. In an embodiment, the first opening 71 may be disposed at a central position of the second opening 72 in plan view, such that the first and second openings are concentric. In other words, the second opening 72 may have a closed loop shape which is spaced apart from the first opening 71 by a first distance. The second mask pattern 76 may be formed of a photoresist layer.

The etch stop layer 52, the first interlayer dielectric layer 51 and the substrate 10 may be etched using the second mask pattern 76 as an etch mask, thereby forming a via hole 21 which is vertically aligned with the first opening 71. The via hole 21 may penetrate the etch stop layer 52 and the first interlayer dielectric layer 51. Further, the via hole 21 may extend from the first surface 11 of the substrate 10 toward the second surface 12 of the substrate 10. The via hole 21 may not penetrate or extend completely through the substrate 10. The first gap 31 may be spaced apart from the via hole 21, and a portion of the substrate 10 may be disposed between the first gap 31 and the via hole 21. The first gap 31 may be formed to surround the via hole 21.

Figure 10C:
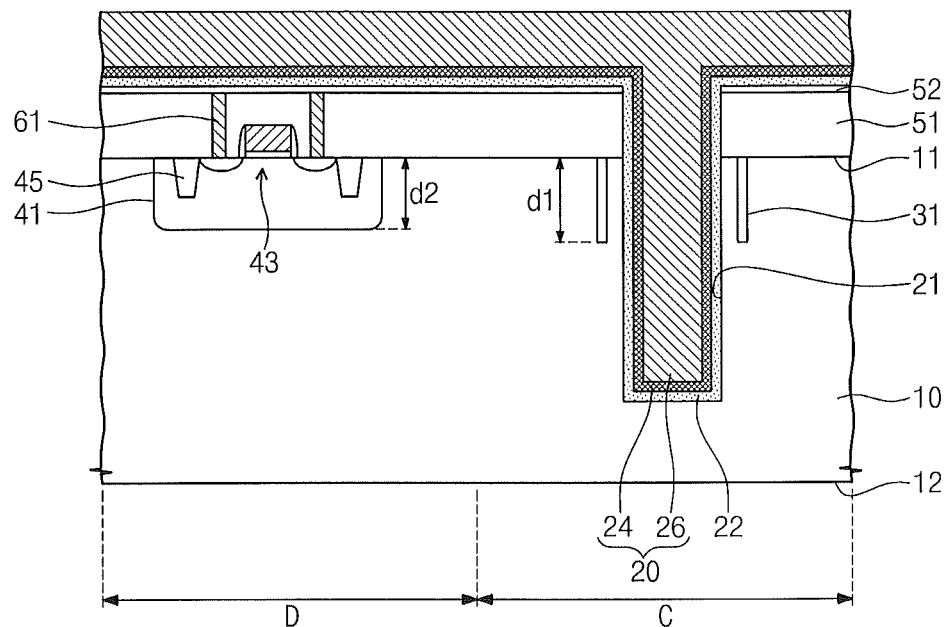

Referring to FIG. 10C, the second mask pattern 76 may be removed. After removal of the second mask pattern 76, a via hole insulation layer 22 may be formed on the substrate opposite to the second surface 12. The via hole insulation layer 22 may be formed to cover an inner wall of the via hole 21.

A through silicon via 20 may be formed on the via hole insulation layer 22 to fill the via hole 21. The through silicon via 20 may be formed to include a barrier layer 24 and a conductive layer 26 on the barrier layer 24.

Figure 10D:
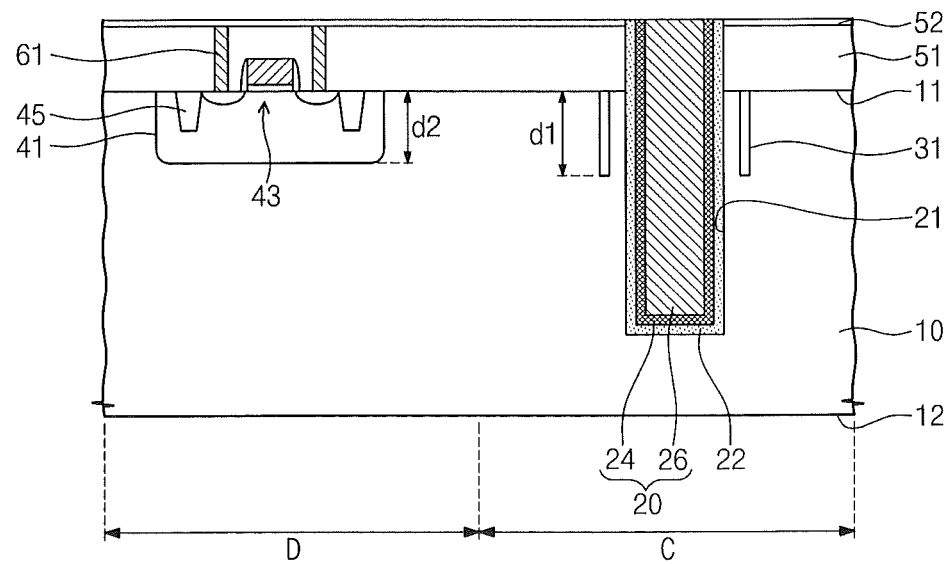

Referring to FIG. 10D, the conductive layer 26 and the barrier layer 24 may be planarized to expose the etch stop layer 52 and to leave the through silicon via 20 in the via hole 21. The via hole insulation layer 22 outside the via hole 21 may also be removed during the planarization process.

Referring again to FIG. 4, the exposed etch stop layer 52 may be removed and a through silicon via capping layer 53 may be formed on the first interlayer dielectric layer 51 opposite to the substrate 10, in a similar manner as described with reference to FIGS. 9E, 9F and 9G. A second interlayer dielectric layer 55 may be formed on the through via capping layer 53. First and second pads 63 and 65 may be formed in the second interlayer dielectric layer 55 and the through silicon via capping layer 53. The first pad 63 may be connected to the through silicon via 20, and the second pad 65 may be connected to the first contact 61. A third interlayer dielectric layer 57 may be formed on the second interlayer dielectric layer 55 and the pads 63 and 65.

A second contact 66 may be formed in the third interlayer dielectric layer 57. A third pad 67 may be formed on the third interlayer dielectric layer 57. The third pad 67 may be connected to the second contact 66. A first passivation layer 58 may be formed to cover the third interlayer dielectric layer 57 and to expose the third pad 67.

A polishing or thinning process may be then applied to the second surface 12 of the substrate 10 after formation of the first passivation layer 58. The polishing process may lead to exposure of the through silicon via 20. The first gap 31 may not be exposed at the second surface 12 even though the polishing process is finished.

The second surface 12 of the polished substrate 10 may be exposed to an etching process so that the conductive layer 26 surrounded by the via hole insulation layer 22 may relatively protrude from the second surface 12 of the etched substrate 10. A second passivation layer 59 may be formed on the second surface 12 of the polished and etched substrate 10. A fourth pad 69 may be formed in the second passivation layer 59. The fourth pad 69 may be connected to the through silicon via 20.

The first gap 31 may correspond to the first stress relief structure described above.

Now, methods of forming the semiconductor device 105 illustrated in FIG. 5 will be described. FIGS. 11A to 11E are cross sectional views taken along a line I-I' of FIG. 1A to illustrate methods of forming a semiconductor device shown in FIG. 5. For the purpose of simplification in explanation, differences between the methods according to the present embodiment and the methods of forming the semiconductor device 101 illustrated in FIGS. 1A to 1D will be mainly described.

Figure 11A:
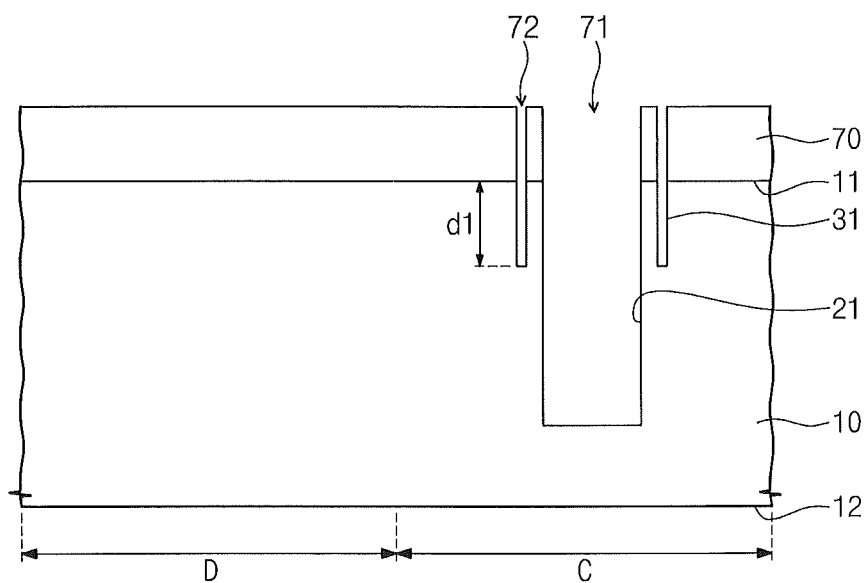
FIGS. 11A to 11E are cross sectional views taken along a line I-I' of FIG. 1A to illustrate methods of forming a semiconductor device shown in FIG. 5.

Referring to FIG. 11A, a substrate 10 may be provided. The substrate 10 may include a connection region C and a circuit or semiconductor element region D adjacent to the connection region C. Further, the substrate 10 may include a first surface 11 and a second surface 12 opposite to the first surface 11. The substrate 10 may be doped with P-type impurities.

A mask pattern 70 may be formed on the first surface 11 of the substrate 10. The mask pattern 70 may have a first opening 71 and a second opening 72 surrounding the first opening 71. The second opening 72 may be spaced apart from the first opening 71. The first and second openings 71 and 72 may expose portions of the etch stop layer 52 in the connection region C. The first opening 71 may have a circular shape in a plan view. That is, the first opening 71 may be defined by a cylindrical empty region. The second opening 72 may have a closed loop shape spaced apart from the first opening 71 by a first distance in a plan view. The second opening 72 may have an elliptical shape, a circular shape, a rectangular shape or an octagonal or other polygonal shape in plan view. A width (corresponding to a diameter) of the first opening 71 may be greater than a width (corresponding to a horizontal thickness) of the second opening 72. The mask pattern 70 may be formed of a photoresist layer.

The substrate 10 may be etched using the mask pattern 70 as an etch mask, thereby forming a via hole 21 and a trench defining a first gap 31 which are vertically aligned with the first opening 71 and the second opening 72 respectively. The via hole 21 may extend from the first surface 11 of the substrate 10 toward the second surface 12 of the substrate 10. The via hole 21 may not penetrate completely through the substrate 10. The first gap 31 may be spaced apart from the via hole 21, and a portion of the substrate 10 may be disposed between the first gap 31 and the via hole 21. The first gap 31 may be formed to surround the via hole 21. The first gap 31 may also extend from the first surface 11 of the substrate 10 toward the second surface 12 of the substrate 10.

The width of the second opening 72 is less than that of the first opening 71. Thus, in the event that the via hole 21 and the first gap 31 are simultaneously formed using a same etching process, a depth d1 of the first gap 31 in the substrate 10 may be less than a depth of the via hole 21 in the substrate 10. A width of the first gap 31 may narrow or be gradually reduced as it becomes closer to the second surface 12 (see FIG. 1E). That is, a lower width of the first gap 31 may be less than an upper width of the first gap 31.

Alternatively, the first gap 31 may be formed using a separate etching technique, for example, a laser drilling process before or after formation of the via hole 21. In an embodiment, the first gap 31 may be deeply formed using an excimer laser to surround the via hole 21. As a result, a sidewall of the first gap 31 may be formed to be substantially perpendicular to a bottom surface of the first gap 31, as illustrated in FIG. 1D.

Figure 11B:
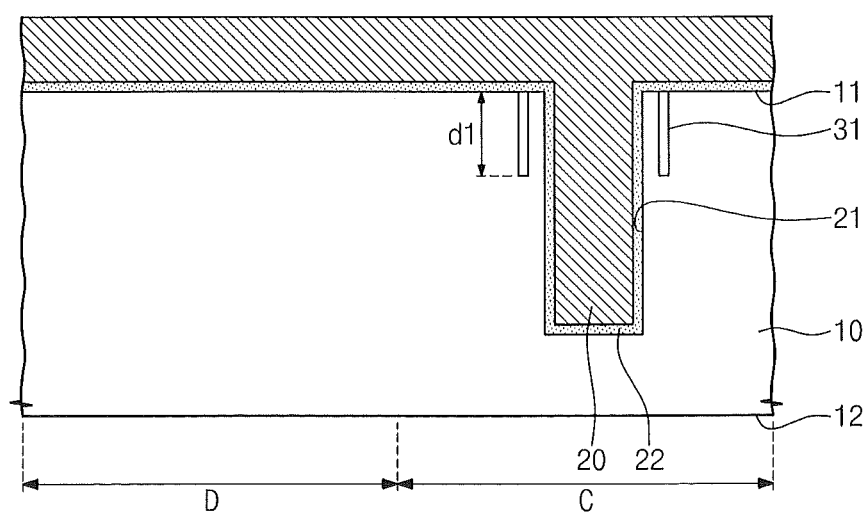

Referring to FIG. 11B, the mask pattern 70 may be removed. A through silicon via 20 may be formed to fill the via hole 21. The through silicon via 20 may include a doped polysilicon layer. Alternatively, the through silicon via 20 may be formed to include a barrier layer and a conductive layer on the barrier layer, as previously described.

A via hole insulation layer 22 may be additionally formed between the via hole 21 and the through silicon via 20. The via hole insulation layer 22 may be formed of a silicon oxide layer, a silicon nitride layer or a combination thereof. In an embodiment, the via hole insulation layer 22 may be formed of a silicon oxide layer. The via hole insulation layer 22 may be formed to cover a sidewall and a bottom surface of the via hole 21. The via hole insulation layer 22 may extend onto an upper portion and a sidewall of the first gap 31. The via hole insulation layer 22 may also be formed to fill a portion of the first gap 31 in some embodiments (see FIGS. 1C to 1E). The material of the through silicon via 20 may also fill a portion of the first gap 31 if the via hole insulation layer 22 fills a portion of the first gap 31.

Figure 11C:
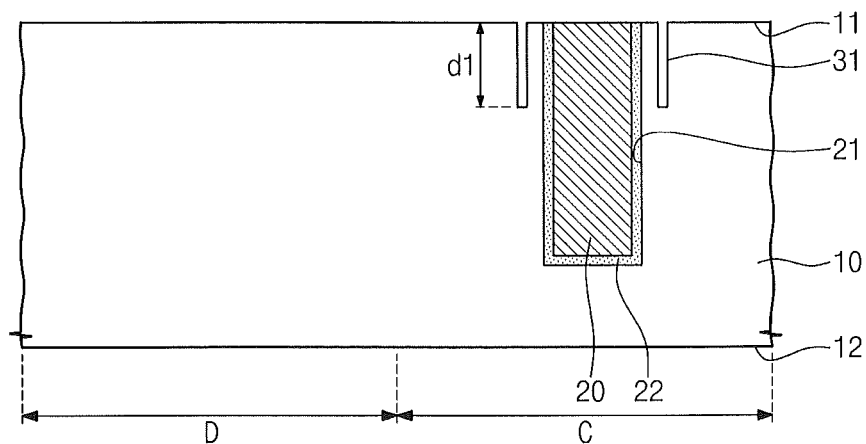

Referring to FIG. 11C, the through silicon via 20 on the first surface 11 of the substrate 10 may be removed using a planarization process. During the planarization process, the via hole insulation layer 22 on the first surface 11 may also be removed.

Figure 11D:
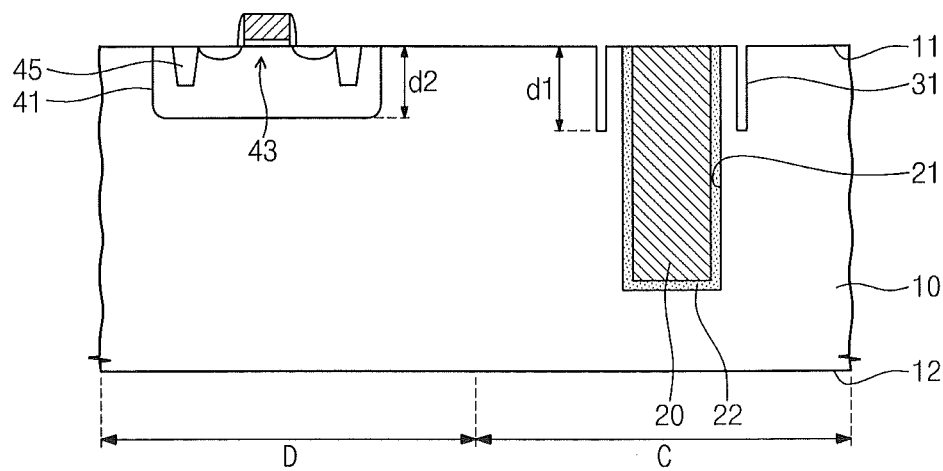

Referring to FIG. 11D, a well 41 may be formed in the substrate 10 of the semiconductor element region D. The well 41 may be formed to be adjacent to the first surface 11. The well 41 may be formed by doping the substrate 10 through the first surface 11 with N-type impurities or P-type impurities. The well 41 may extend to a depth d2 that is less than the depth of d1 of the gap 31. The depth d2 of the well 41 may be defined as a distance from the first surface 11 to a position that an impurity concentration of the well 41 abruptly decreases.

A semiconductor element 43 or other microelectronic component may be formed on and in the well 41. The semiconductor element 43 may include a transistor. For example, the semiconductor element 43 may include an NMOS transistor, a PMOS transistor or a bipolar transistor. An isolation structure 45 may be formed in the well 41 to surround the semiconductor element 43. The isolation structure 45 may be formed using a shallow trench isolation (STI) technique.

Figure 11E:
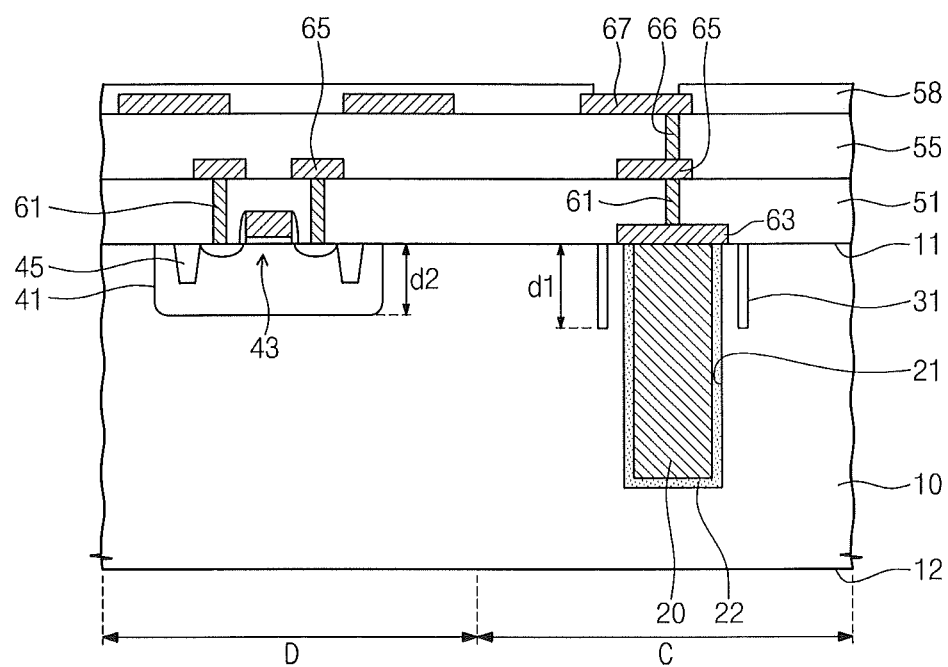

Referring to FIG. 11E, a first pad 63 may be formed on the first surface 11 of the substrate 10 to cover the through silicon via 20. That is, the first pad 63 may be connected to the through silicon via 20. A first interlayer dielectric layer 51 may be formed on the first surface 11 to cover the semiconductor element 43, the first pad 63 and the first gap 31.

First contacts 61 may be formed in the first interlayer dielectric layer 51. One of the first contacts 61 may be connected to one of impurity regions of the semiconductor element 43 or the first pad 63. Second pads 65 may be formed on the first interlayer dielectric layer 51. One of the second pads 65 may be connected to one of the first contacts 61.

A second interlayer dielectric layer 55 may be formed on the first interlayer dielectric layer 51 and the second pads 65. Second contacts 66 may be formed in the second interlayer dielectric layer 55. The second contacts 66 may be connected to the second pads 65. Third pads 67 may be formed on the second interlayer dielectric layer 55. One of the third pads 67 may be connected to the second contact 66.

A first passivation layer 58 may be formed to cover the second interlayer dielectric layer 55 and to expose the third pad 67. The first passivation layer 58 may protect an integrated circuit including the semiconductor element 43 from an external environment. The first passivation layer 58 may be formed of a silicon oxide layer, a silicon nitride layer or a combination thereof. The pads 63, 65 and 67 may be formed of an aluminum layer or a tungsten layer.

Referring again to FIG. 5, a polishing or thinning process may be then applied to the second surface 12 of the substrate 10 after formation of the first passivation layer 58. The polishing process may lead to exposure of the through silicon via 20 at the second surface 12. The polishing process may be similar to that described in the above embodiments.

A second passivation layer 59 may be formed on the second surface 12 of the polished substrate 10. A fourth pad 69 may be formed in the second passivation layer 59. The fourth pad 69 may be connected to the through silicon via 20. The second passivation layer 59 may be formed of a silicon oxide layer, a silicon nitride layer or a combination thereof. The fourth pad 69 may be formed of a copper layer.

Methods of forming the semiconductor device 106 according to the embodiment described with reference to FIG. 6 may be similar to the method of forming the semiconductor device 101 described with reference to FIG. 1B. For the purpose of simplification in explanation, differences between the methods according to the present embodiment and the methods of forming the semiconductor device 101 illustrated in FIGS. 1A to 1D will be mainly described.

Referring again to FIG. 6, forming the via hole 21 and the first gap 31 of the semiconductor device 106 according to the present embodiment may be performed after formation of the second interlayer dielectric layer 55, in contrast to the previous embodiment illustrated in FIGS. 1A to 1D.

A third pad 67 may be formed on the second interlayer dielectric layer 55. A first passivation layer 58 may be formed to cover the second interlayer dielectric layer 55 and to expose the third pad 67. The first passivation layer 58 may protect an integrated circuit including the semiconductor element 43 from an external environment. The first passivation layer 58 may be formed of a silicon oxide layer, a silicon nitride layer or a combination thereof. The pads 63, 65 and 67 may be formed of an aluminum layer or a copper layer, and the contacts 61 and 66 may be formed of an aluminum layer or a tungsten layer.

Methods of forming the semiconductor device 107 according to the embodiment described with reference to FIG. 7 may be similar to the method of forming the semiconductor device 106 described with reference to FIG. 6. One difference between the present embodiment and the previous embodiment of FIG. 6 involves the process step of forming the via hole 21 and the first stress relief structure 31. That is, the via hole 21 and the first stress relief structure 31 of the present embodiment may be formed using two separate processes, as described in the embodiment illustrated in FIG. 4. For example, the first stress relief structure 31 in the present embodiment may be formed after first formation of the first interlayer dielectric layer 51 and prior to formation of the second interlayer dielectric layer 55. Thus, the first stress relief structure 31 of the semiconductor device 107 according to the present embodiment may not penetrate and may be confined below the second interlayer dielectric layer 55. In the present embodiment, the first stress relief structure 31 may be formed using an etching process or a laser drilling process described in the above embodiments. The first stress relief structure 31 may include a void or an air gap therein.

Methods of forming the semiconductor device 108 according to the embodiment described with reference to FIG. 8 may be similar to the method of forming the semiconductor device 106 described with reference to FIG. 6. One difference between the present embodiment and the previous embodiment of FIG. 6 involves the process step of forming the via hole 21 and the first stress relief structure 31. That is, the via hole 21 and the first stress relief structure 31 of the present embodiment may be formed using two separate processes, as described in the embodiment illustrated in FIG. 4. For example, the first stress relief structure 31 in the present embodiment may be formed prior to formation of the first interlayer dielectric layer 51. Thus, the first stress relief structure 31 of the semiconductor device 108 according to the present embodiment may not penetrate and may be confined below the first interlayer dielectric layer 51. In the present embodiment, the first stress relief structure 31 may be formed using an etching process or a laser drilling process described in the above embodiments. The first stress relief structure 31 may include a cavity or an air gap therein.

As described above, the interlayer dielectric layers, the passivation layers, the contacts and/or the pads may be formed after forming the through silicon via 20. The back-end processes performed after formation of the through silicon via 20 may be carried out at a temperature higher than a room temperature. In addition, the semiconductor device including the through silicon via 20 may generate heat during a device operation. Further, the through silicon via 20 may be formed of a metal layer. The through silicon via 20 formed of a metal layer may expand or contract according to the variation of environmental temperature. A coefficient of thermal expansion of the through silicon via 20 may be different from a coefficient of thermal expansion of the substrate 10, for example, a silicon substrate. Thus, the substrate 10 may be under the influence of thermal stress when the back-end processes are performed and/or when the semiconductor device operates. The thermal stress may affect characteristics of the semiconductor device, particularly, the transistors. However, the stress relief structures of the semiconductor devices according to embodiments of the inventive concept may reduce or release the thermal stress that affects the characteristics of the semiconductor device described above.

Various characteristics of transistors of the semiconductor devices fabricated according to the embodiments will be described in detail hereinafter. For example, FIGS. 12A, 12B, 13A and 13B are graphs showing simulation results of the characteristics of the transistors of the semiconductor devices including the stress relief structures described with reference to FIGS. 1A to 1D. The data in these graphs were simulated under the assumption that the substrate 10 was a silicon substrate and the silicon substrate had a thickness of 500 μm. Further, the diameter of the through silicon via 20 was 5 μm, and the height of the through silicon via 20 was 50 μm. The depth of the first stress relief structure 31 was varied from 1 μm to 15 μm. The width of the first stress relief structure 31 was 1 μm. A horizontal thickness (e.g., a width) of the substrate between the through silicon via 20 and the first stress relief structure 31 was 1 μm. The transistors were PMOS transistors and NMOS transistors. The channel width and the channel length of the long channel transistors were 5 μm and 10 μm, respectively. The channel width and the channel length of the short channel transistors were 0.1 μm and 0.03 μm, respectively.

Figure 12A:
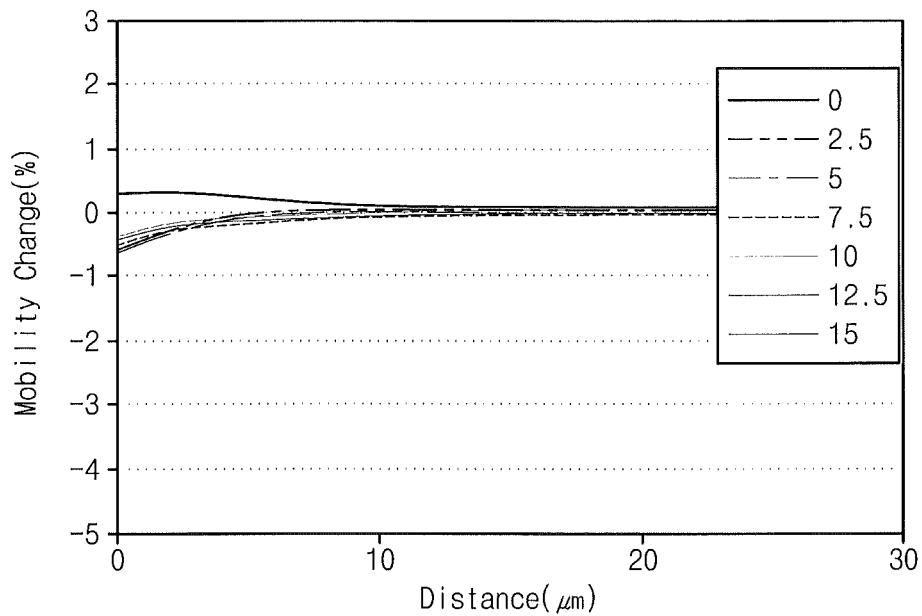
FIG. 12A is a graph illustrating mobility characteristics of long channel NMOS transistors as a function of a depth of a first stress relief structure.
Figure 12B:
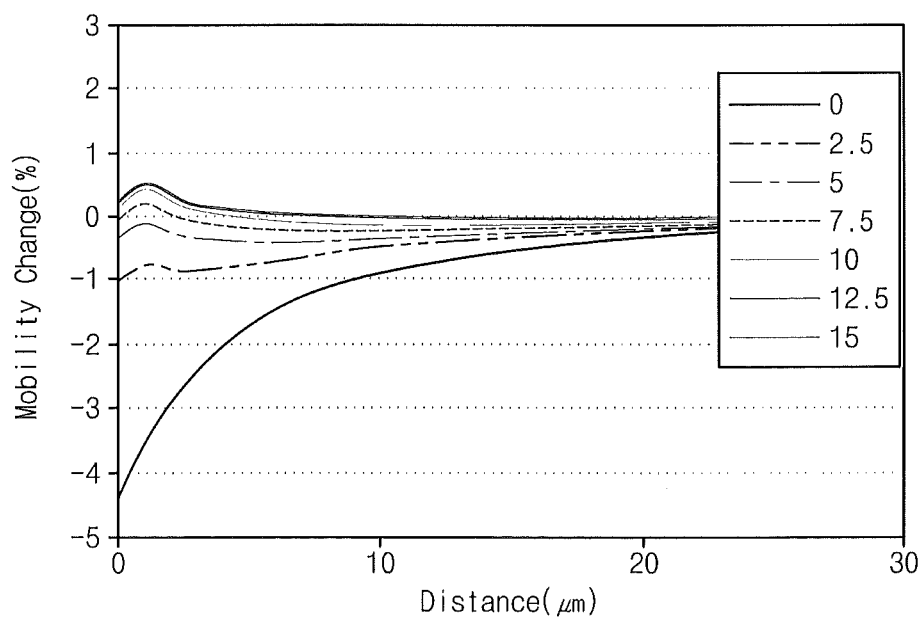
FIG. 12B is a graph illustrating mobility characteristics of long channel PMOS transistors as a function of a depth of a first stress relief structure.

In the graphs of FIGS. 12A, 12B, 13A and 13B, the abscissa indicates a distance between the through silicon via and the transistor, and the ordinate indicates a variation rate of the carrier mobility of the transistors. As shown in FIGS. 12A and 12B, the thermal stress due to the through silicon via highly influenced the PMOS transistors rather than the NMOS transistors in terms of the variation rate of the carrier mobility, as the conductive via electrode was closer to the transistor.

FIG. 12A illustrates the characteristic variation of the long channel NMOS transistors according to the depth of the first stress relief structure, and FIG. 12B illustrates the characteristic variation of the long channel PMOS transistors according to the depth of the first stress relief structure. Referring to FIGS. 12A and 12B, the thermal stress due to the through silicon via highly influenced the mobility of the PMOS transistors to a greater extent than the NMOS transistors, as mentioned above. In the case where the first stress relief structure had a depth greater than 2.5 μm, the NMOS transistors exhibited a mobility variation rate of about 0.5% or less. In the case where the first stress relief structure had a depth of 2.5 μm, the PMOS transistors exhibited a mobility variation rate of about 1%. In the case where the first stress relief structure had a depth of 5 μm, the PMOS transistors exhibited a mobility variation rate of about 0.5% or less. Thus, from the simulation results shown in FIGS. 12A and 12B, it can be understood that the characteristics of the semiconductor devices may not be significantly degraded when the first stress relief structure has a depth of about 2.5 μm or the greater.

Figure 13A:
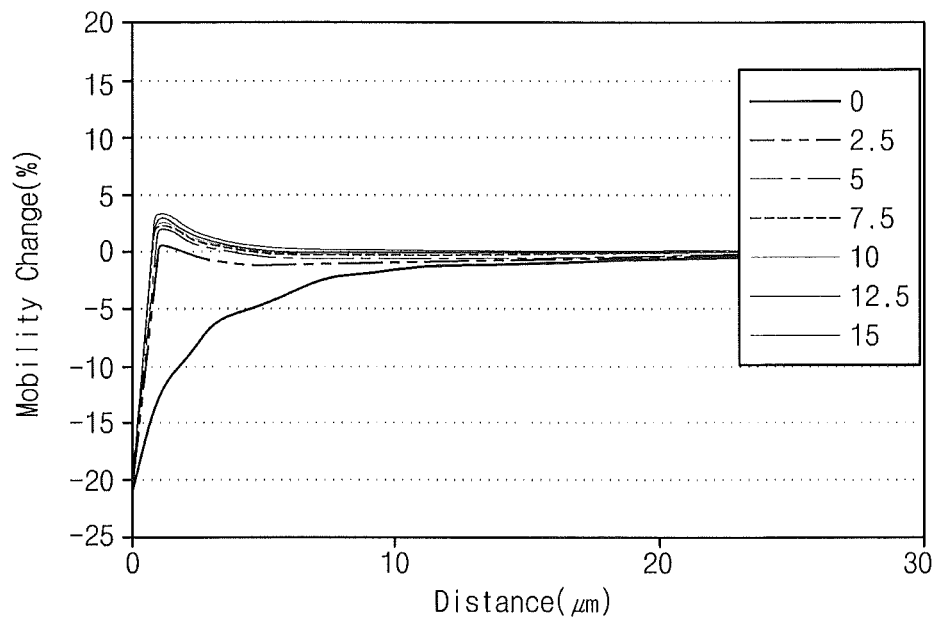
FIG. 13A is a graph illustrating mobility characteristics of short channel PMOS transistors as a function of a depth of a first stress relief structure.
Figure 13B:
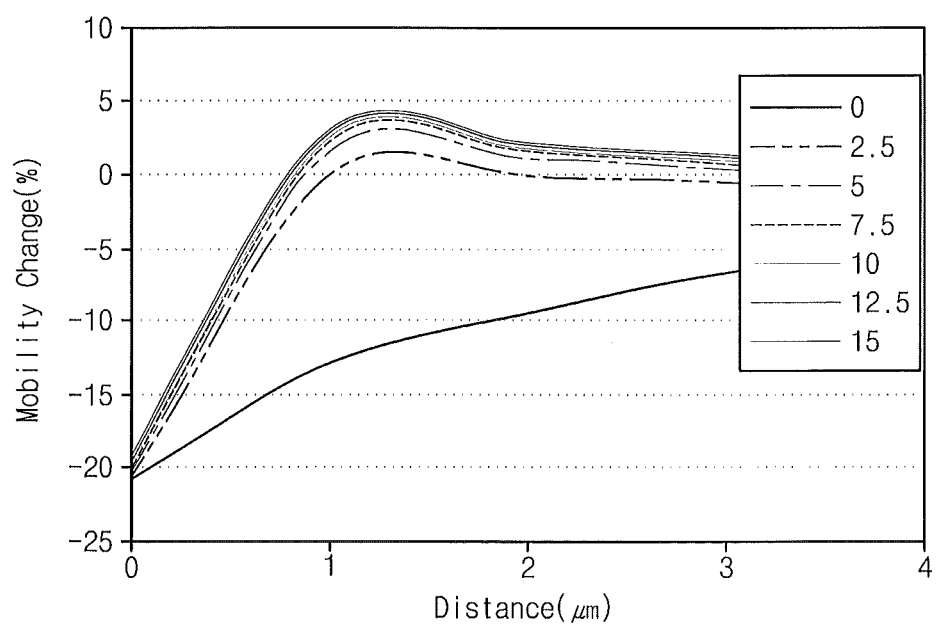
FIG. 13B is an enlarged view of a portion of FIG. 13A.

FIG. 13A illustrates the characteristic variation of the short channel PMOS transistors according to the depth of the first stress relief structure, and FIG. 13B illustrates an enlarged view of a portion of FIG. 13A. Referring to FIGS. 13A and 13B, it can be understood that the portion of the substrate between the through silicon via and the first stress relief structure is exposed to significantly higher stress. In contrast, it can be understood that the stress from the through silicon via is significantly lower in the portions of the substrate outside the first stress relief structure opposite to the through silicon via.

Meanwhile, the characteristics of the transistors were almost unchanged when the distance between the through silicon via and the first stress relief structure was between about 1 μm to 5 μm. Further, when the width of the first stress relief structure was 1 nm to 1000 nm, the characteristics of the transistors were almost unchanged.

Figure 14:
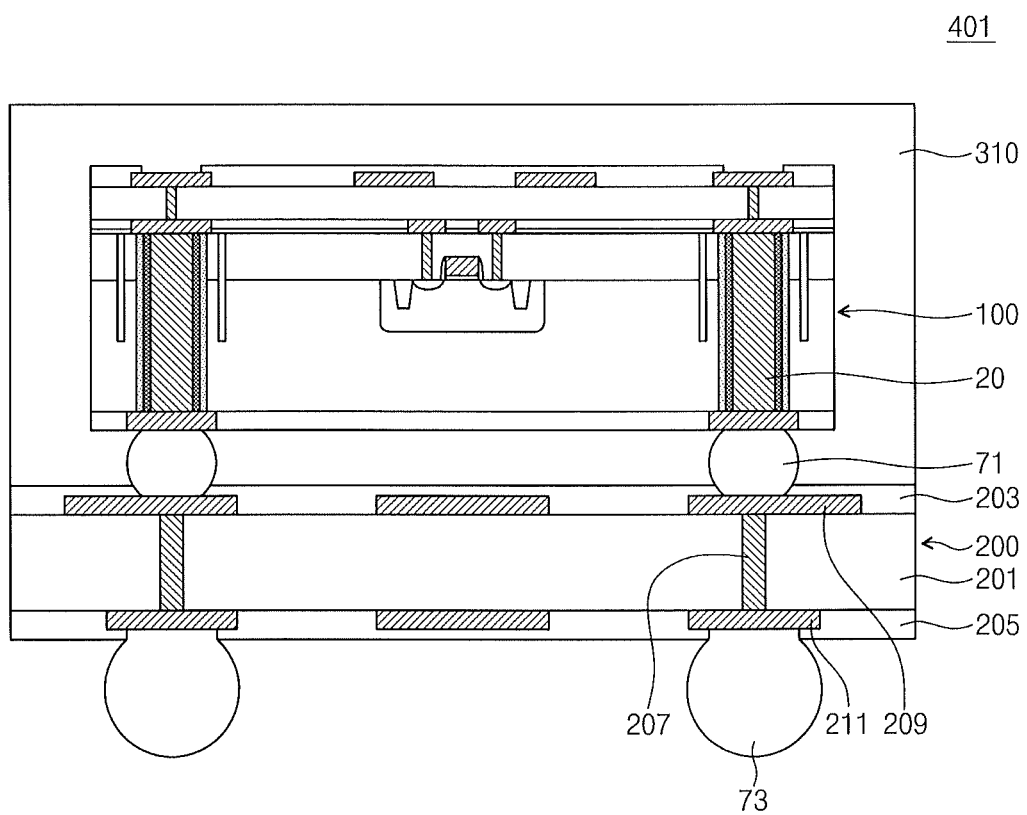
FIG. 14 illustrates an example of semiconductor packages according to embodiments of the inventive concept.
Figure 15:
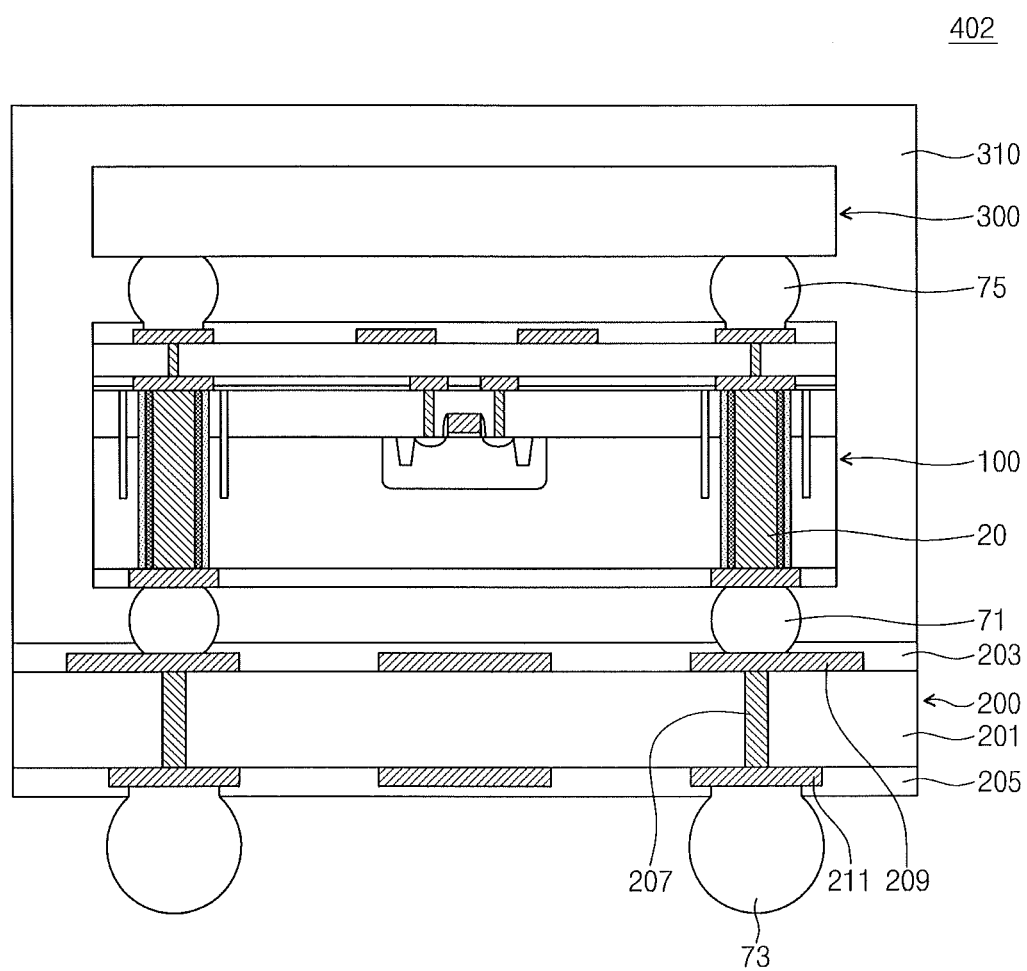
FIG. 15 illustrates another example of semiconductor packages according to embodiments of the inventive concept.
Figure 16:
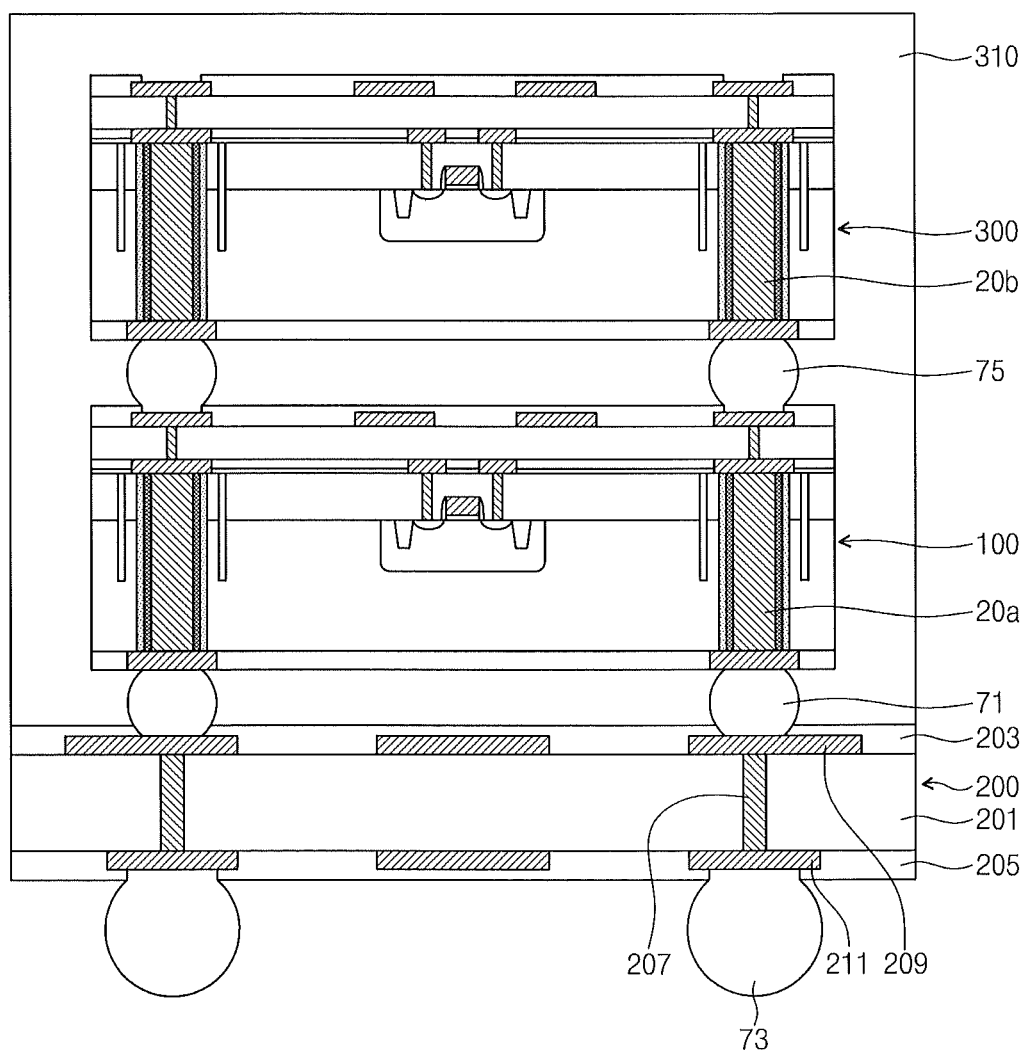
FIG. 16 illustrates a still another example of semiconductor packages according to embodiments of the inventive concept.

FIGS. 14 to 16 illustrate examples of semiconductor packages according to embodiments of the inventive concept.

Referring to FIG. 14, an example 401 of a semiconductor package or multi-chip module according to embodiments of the inventive concept may include a package or module substrate 200 and a semiconductor or other microelectronic device 100 mounted on the package substrate 200. The package substrate 200 may be a printed circuit board (PCB) substrate. The package substrate 200 may include an insulating substrate 201, a package substrate through via 207 penetrating and extending through the insulating substrate 201, conductive patterns 209 and 211 disposed on the top and bottom surfaces of the insulation substrate 201, and package substrate insulation layers 203 and 205 covering the conductive patterns 209 and 211. The semiconductor device 100 may correspond to one of the semiconductor devices described with reference to FIGS. 1A to 8.

The semiconductor device 100 may be mounted on the package substrate 200. For example, the package substrate 200 may be disposed on the second surface of 12 the substrate 10 opposite to the first surface 11. That is, the semiconductor device 100 and/or one or more components thereof may be electrically connected to the package substrate 200 through the via 20 and the first bumps 71. Second bumps 73 may be attached to a bottom surface of the package substrate 200 opposite to the first bumps 71. The bumps 71 and 73 may correspond to solder balls, conductive bumps, conductive spacers, pin grid arrays or a combination thereof. The semiconductor package 401 may further include a mold layer 310 covering the semiconductor device 100. The mold layer 310 may include an epoxy molding compound material.

Referring to FIG. 15, another example 402 of a semiconductor package according to embodiments of the inventive concept may include a package or module substrate 200 and first and second semiconductor devices 100 and 300 mounted on the package substrate 200. The package substrate 200 may be a printed circuit board (PCB) substrate. The package substrate 200 may include an insulation substrate 201, a package substrate through via 207 penetrating the insulation substrate 201, conductive patterns 209 and 211 disposed on the top and bottom surfaces of the insulation substrate 201, and package substrate insulation layers 203 and 205 covering the conductive patterns 209 and 211. The first semiconductor device 100 may correspond to one of the semiconductor devices described with reference to FIGS. 1A to 8. The second semiconductor device 300 may correspond to a memory chip or a logic chip which is different from the first semiconductor device 100. The second semiconductor device 300 may not include the through silicon via.

The first semiconductor device 100 may be electrically connected to the package substrate 200 through the via 20 and the first bumps 71. The second semiconductor device 300 may be mounted on the first semiconductor device 100 opposite the package substrate 200 using a flip chip bonding technique. The second semiconductor device 300 may be electrically connected to the first semiconductor device 100 through third bumps 75. As such, the via 20 provides an electrical connection between the second device 300 and the package substrate 200. The first semiconductor device 100 may act as an interposer. The number of third bumps 75 may be two or more, and the number of the through silicon vias 20 may also be two or more. A distance between the third bumps 75 may be different from a distance between the through silicon vias 20.

Second bumps 73 may be attached to a bottom surface of the package substrate 200 opposite the first bumps 71. The bumps 71, 73 and 75 may correspond to solder balls, conductive bumps, conductive spacers, pin grid arrays or a combination thereof. The semiconductor package 402 may further include a mold layer 310 covering the first and second semiconductor devices 100 and 300. The mold layer 310 may include an epoxy molding compound material.

Referring to FIG. 16, still another example 403 of a semiconductor packages according to embodiments of the inventive concept may include a package or module substrate 200 and first and second semiconductor devices 100 and 300 mounted on the package substrate 200. The semiconductor package 403 may be a multi chip package. The first and second semiconductor devices 100 and 300 may have a similar type of configuration and a similar structure in some embodiments.

The package substrate 200 may be a printed circuit board (PCB) substrate. The package substrate 200 may include an insulation substrate 201, a package substrate through via 207 penetrating the insulation substrate 201, conductive patterns 209 and 211 disposed on the top and bottom surfaces of the insulation substrate 201, and package substrate insulation layers 203 and 205 covering the conductive patterns 209 and 211. The first and second semiconductor devices 100 and 300 may have the same structure as one of the semiconductor devices described with reference to FIGS. 1A to 8.

The first and second semiconductor devices 100 and 300 may include first through silicon via 20a and second through silicon via 20b, respectively. The first through silicon via 20a and the second through silicon via 20b may be sequentially stacked to overlap with each other in plan view. The first through silicon via 20a may be electrically connected to the second through silicon via 20b. The second through silicon via 20b may be connected to the first through silicon via 20a through third bumps 75.

The first semiconductor device 100 may be electrically connected to the package substrate 200 through first bumps 71. The first semiconductor device 100 may act as an interposer. Second bumps 73 may be attached to a bottom surface of the package substrate 200 opposite the first bumps 71. The bumps 71, 73 and 75 may correspond to solder balls, conductive bumps, conductive spacers, pin grid arrays or a combination thereof. The semiconductor package 403 may further include a mold layer 310 covering the first and second semiconductor devices 100 and 300. The mold layer 310 may include an epoxy molding compound material.

The semiconductor packages according to the above embodiments may be configured to have a structure that at least one semiconductor device is electrically connected to the package substrate by the through silicon via. However, the semiconductor packages according to the above embodiments are not limited to the embodiments described above. For example, some of the pads of the semiconductor device may be electrically connected to the package substrate through bonding wires.

Figure 17:
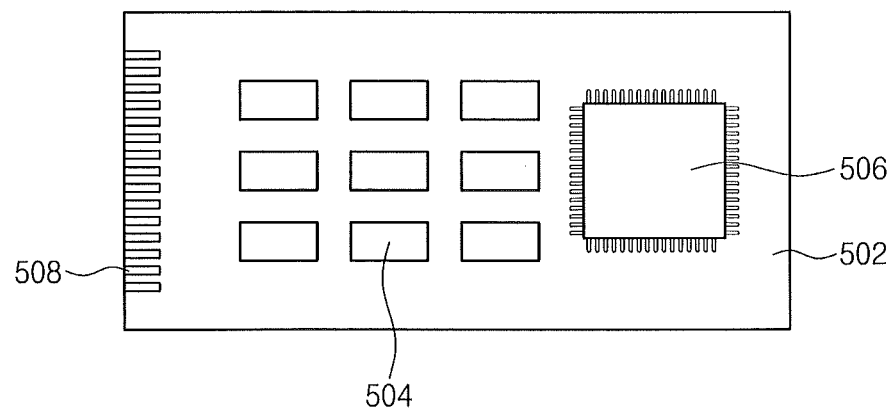
FIG. 17 is a plan view illustrating a package module including a semiconductor device according to embodiments of the inventive concept.

FIG. 17 is a plan view illustrating a package module including a semiconductor device according to embodiments of the inventive concept. Referring to FIG. 17, a package module 500 according to an embodiment of the inventive concept may include a module substrate 502 having terminals 508 connected to an external device, at least one semiconductor chip 504 mounted on the module substrate 502, and a semiconductor package 506 having a quad flat package (QFP) type configuration. The semiconductor chip 504 and/or the semiconductor package 506 may include a semiconductor device according to the embodiments described above. The package module 500 may be connected to an external electronic device through the terminals 508.

Figure 18:
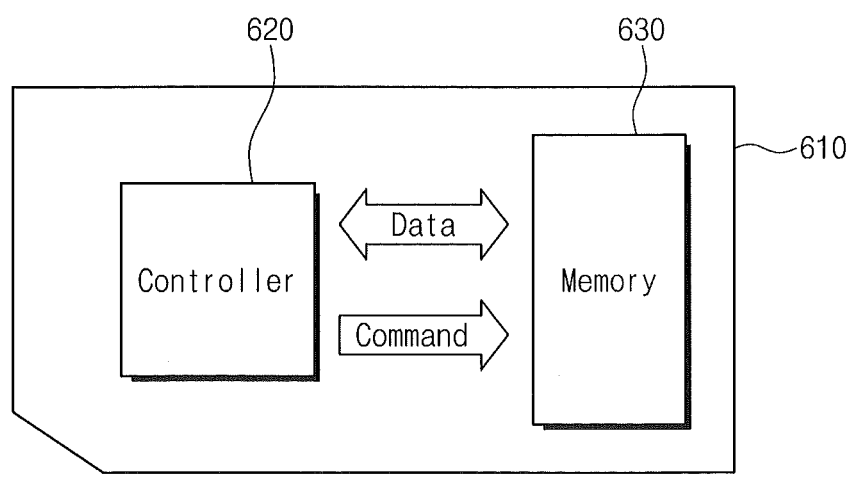
FIG. 18 is a schematic block diagram illustrating a memory card including a semiconductor device according to embodiments of the inventive concept.

FIG. 18 is a schematic block diagram illustrating a memory card including a semiconductor device according to embodiments of the inventive concept. Referring to FIG. 18, a memory card 600 according to an embodiment of the inventive concept may include a housing 610 as well as a controller 620 and a memory 630 disposed in the housing 610. The controller 620 and the memory 630 may transmit and receive electrical data to and from each other. For example, the controller 620 and the memory 630 may transmit and receive the electrical data to and from each other according to commands from the controller 620. Thus, the memory card 600 may store data in the memory 630 and/or may output the data in the memory 630 to an external device.

The controller 620 and/or the memory 630 may include at least one of the semiconductor devices and/or semiconductor packages according to embodiments of the inventive concept. The memory card 600 may be used as a data storage media of various portable systems. For example, the memory card 600 may include a multi media card MMC or a secure digital (SD) card.

Figure 19:
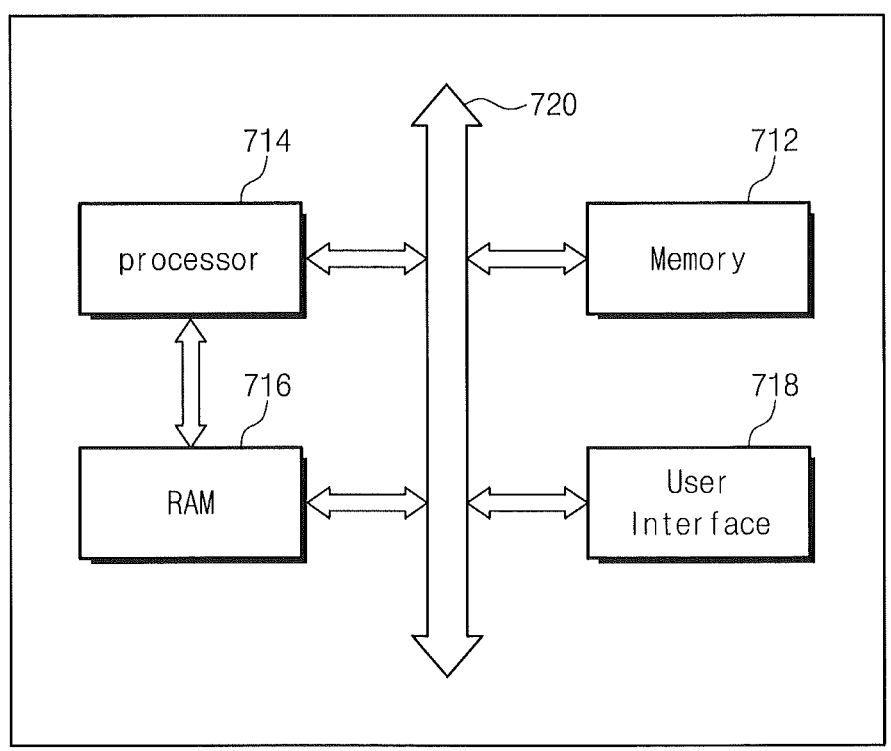
FIG. 19 is a schematic block diagram illustrating an electronic system including a semiconductor device according to embodiments of the inventive concept.

FIG. 19 is a schematic block diagram illustrating an electronic system 700 according to embodiments of the inventive concept. Referring to FIG. 19, the electronic system 700 may include at least one of the semiconductor devices and/or semiconductor packages according to embodiments of the inventive concept. The electronic system 700 may include a mobile system or a computer. For example, the electronic system 700 may include a memory system 712, a processor 714, a random access memory (RAM) 716 and a user interface 718. The memory system 712, the processor 714, the random access memory (RAM) 716 and the user interface 718 may communicate with each other through a data bus 720. The processor 714 may execute a program and may control operation of the electronic system 700. The RAM 716 may be used as an operation memory of the processor 714. For example, the processor 714 and the RAM 716 may include one of the semiconductor devices according to embodiments of the inventive concept and one of the semiconductor packages according to the embodiments of the inventive concept, respectively. The processor 714 and the RAM 716 may be encapsulated in a single package. The user interface 718 may be used to input data from an external device into the electric system 700 or output the data of the electronic system 700 to the external device. The memory system 712 may store a code for operating the processor 714, data processed by the processor 714 or data received from an external device. The memory system 712 may include a controller and a memory. The memory system 712 may have substantially the same configuration as the memory card 600 illustrated in FIG. 18.

The electronic system 700 may be applied to an electronic control system of the various electronic products.

Figure 20:
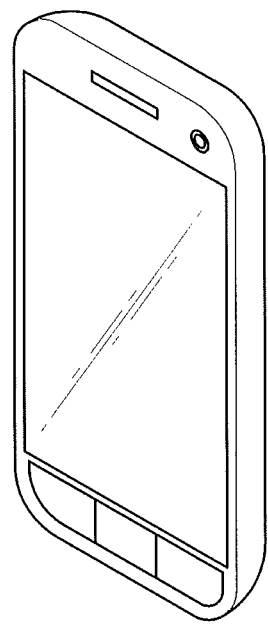
FIG. 20 is a schematic view illustrating a mobile phone to which the electronic system of FIG. 19 is applied.

FIG. 20 is a schematic view illustrating a mobile phone in which the electronic system 700 of FIG. 19 can be used. In other embodiments, the electronic system 700 of FIG. 19 may be used in portable notebook computers, MP3 players, navigators, solid state disks (SSDs), automobiles or household appliances.

According to the embodiments set forth above, the stress relief structure may be formed to surround the through silicon via penetrating a substrate. Thus, electrical characteristics and/or reliability of semiconductor elements formed adjacent to the through silicon via may be improved because of the presence of the stress relief structure formed between the semiconductor elements and the through silicon via.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A microelectronic device, comprising:
   a substrate including at least one microelectronic component on a surface thereof;
   a via electrode comprising a conductive material extending through the substrate, wherein the at least one microelectronic component on the surface of the substrate is laterally spaced apart from the via electrode;
   a stress relief structure including a trench and a trench insulating layer extending at least partially therein, the trench having a gap region therein extending into the surface of the substrate between the via electrode and the microelectronic component, wherein the stress relief structure is spaced apart from the via electrode such that a portion of the substrate that is free of microelectronic components extends therebetween, wherein the gap region is not enclosed within the substrate; and
   a via insulating layer extending along sidewalls of the via electrode between the via electrode and the trench, wherein the via insulating layer and the trench insulating layer comprise portions of a same material layer.

2. The device of claim 1, wherein the trench extends into the substrate in a direction substantially parallel to the via electrode, and wherein the portion of the substrate separates the via electrode from the trench.

3. The device of claim 2, wherein the trench surrounds the via electrode in plan view.

4. The device of claim 3, wherein the trench defines a continuous polygonal or elliptical shape in plan view.

5. The device of claim 1, wherein the stress relief structure comprises a first stress relief structure including a first gap region therein, and further comprising:
a second stress relief structure including a second gap region therein extending into the surface of the substrate between the first stress relief structure and the at least one microelectronic component.

6. The device of claim 5, wherein the second stress relief structure surrounds the at least one microelectronic component in plan view.

7. The device of claim 2, wherein the gap region is defined between sidewalls of the trench.

8. The device of claim 7, wherein the gap region is bounded by the substrate at one end thereof but is not enclosed within the trench at an opposite end thereof.

9. The device of claim 7, wherein the gap region is enclosed by at least one of a trench insulating layer, a barrier layer, and/or a conductive layer.

10. The device of claim 8, wherein the at least one microelectronic component on the surface of the substrate is laterally spaced apart from the via electrode by about 0.5 micrometers or less.

11. The device of claim 1, wherein the trench insulating layer conformally extends along sidewalls of the trench, and wherein the gap region comprises a cavity confined within the trench insulating layer.

12. The device of claim 11, wherein sidewalls of the cavity are tapered as the trench extends into the substrate.

13. The device of claim 11, wherein sidewalls of the cavity are substantially perpendicular to a bottom surface of the trench.

14. The device of claim 1, wherein a diameter of the via electrode is greater than a width of the stress relief structure in plan view.

15. The device of claim 14, wherein the width of the stress relief structure is about 10 micrometers or less, and wherein a depth of the stress relief structure is about 2.5 micrometers or more.

16. The device of claim 1, wherein the portion of the substrate separates the stress relief structure from the via electrode by a distance of at least 0.1 micrometers.

17. The device of claim 1, wherein the stress relief structure extends into the surface of the substrate beyond a well region of the at least one microelectronic component.

18. The device of claim 17, wherein the stress relief structure extends completely through the substrate.

19. The device of claim 1, wherein the stress relief structure is confined below the surface of the substrate including the at least one microelectronic component thereon.

20. The device of claim 1, further comprising:
one or more interlayer insulating layers on the surface of the substrate including the at least one microelectronic component thereon,
wherein the stress relief structure extends beyond the surface of the substrate and into at least one of the one or more interlayer insulating layers.

21. The device of claim 1, wherein the via electrode comprises a conductive layer and a barrier layer configured to prevent atomic diffusion from the conductive layer into the substrate.

22. The device of claim 1, further comprising:
a device isolation structure extending into the surface of the substrate and spaced apart from the stress relief structure, wherein the device isolation structure surrounds the at least one microelectronic component on the surface of the substrate in plan view.

23. A multi-chip module, comprising:
a module substrate; and
a first microelectronic device on the module substrate;
wherein the first microelectronic device comprises a microelectronic device according to claim 1, and wherein the via electrode provides an electrical connection between the first microelectronic device and the module substrate.

24. The module of claim 23, further comprising:
a second microelectronic device on the first microelectronic device,
wherein the via electrode provides an electrical connection between the second microelectronic device and the module substrate.

25. The module of claim 23, wherein the module comprises a system in package (SIP), wherein one of the first and second microelectronic devices comprises a memory device, and wherein the other of the first and second microelectronic devices comprises a memory controller.

26. An electronic system, comprising:
a processor;
a memory;
a user interface; and
a bus configured to provide communication between the processor, the memory, and the user interface,
wherein at least one of the processor and the memory comprises a microelectronic device according to claim 1.

* * * * *